United States Patent
Choi et al.

(10) Patent No.: US 11,799,063 B2
(45) Date of Patent: Oct. 24, 2023

(54) DISPLAY APPARATUS COMPRISING LIGHT EMITTING DEVICES COUPLED TO A WIRING BOARD WITH CONDUCTIVE ADHESIVE

(71) Applicant: LG ELECTRONICS INC., Seoul (KR)

(72) Inventors: Hwanjoon Choi, Seoul (KR); Kyoungtae Wi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 67 days.

(21) Appl. No.: 17/511,268

(22) Filed: Oct. 26, 2021

(65) Prior Publication Data

US 2022/0052243 A1  Feb. 17, 2022

Related U.S. Application Data

(63) Continuation of application No. 16/461,282, filed as application No. PCT/KR2016/015338 on Dec. 27, 2016, now Pat. No. 11,189,767.

(30) Foreign Application Priority Data

Nov. 17, 2016 (KR) .................. 10-2016-0153501

(51) Int. Cl.
*H01L 33/62* (2010.01)
*H01L 27/15* (2006.01)

(52) U.S. Cl.
CPC ............ *H01L 33/62* (2013.01); *H01L 27/156* (2013.01); *H01L 2933/0066* (2013.01)

(58) Field of Classification Search
CPC ...................................................... H01L 33/62
(Continued)

(56) References Cited

U.S. PATENT DOCUMENTS

| 2009/0039168 A1 | 2/2009 | Sakurai et al. |
| 2012/0112215 A1 | 5/2012 | Chai et al. |

(Continued)

FOREIGN PATENT DOCUMENTS

| EP | 2888729 B1 | 9/2018 |
| JP | 62-179780 A | 8/1987 |

(Continued)

*Primary Examiner* — Ajay Arora
(74) *Attorney, Agent, or Firm* — Birch, Stewart, Kolasch & Birch, LLP

(57) ABSTRACT

Discussed is a display apparatus including a wiring board having wiring electrodes; a conductive adhesive layer covering the wiring electrodes; a plurality of semiconductor light emitting devices coupled to the conductive adhesive layer and electrically connected to the wiring electrodes; and an insulating material disposed between the plurality of adhesive regions to fill between the plurality of semiconductor light emitting devices, wherein each electrode of the plurality of semiconductor light emitting devices includes a first conductive electrode, a first conductive semiconductor layer on the first conductive electrode, an active layer on the first conductive semiconductor layer, a second conductive semiconductor layer on the active layer, and a second conductive electrode on the second conductive semiconductor layer, and wherein the second conductive electrode is disposed on one surface of the second conductive semiconductor layer.

20 Claims, 27 Drawing Sheets

(58) Field of Classification Search
USPC .......................................................... 257/79
See application file for complete search history.

(56) References Cited

U.S. PATENT DOCUMENTS

| | | |
|---|---|---|
| 2015/0034989 A1 | 2/2015 | Namiki et al. |
| 2016/0043061 A1* | 2/2016 | Rhee ..................... H01L 24/95 |
| | | 257/89 |
| 2019/0252588 A1 | 8/2019 | Maki |

FOREIGN PATENT DOCUMENTS

| | | |
|---|---|---|
| JP | 2015-88744 A | 5/2015 |
| KR | 10-2011-0001481 A | 1/2011 |
| KR | 10-2014-0025055 A | 3/2014 |
| KR | 10-2015-0073526 A | 7/2015 |
| KR | 10-2016-0087264 A | 7/2016 |
| WO | WO 2016/047134 A1 | 3/2016 |
| WO | WO 2016/100662 A1 | 6/2016 |

* cited by examiner (a)

(b)

(c)

(d)

(a)

(b)

(c)

(d)

(a)

(b)

(c)

(d)

(a)

(b)

(c)

(d)

(a)

(b)

(c)

(d)

(e)

DISPLAY APPARATUS COMPRISING LIGHT EMITTING DEVICES COUPLED TO A WIRING BOARD WITH CONDUCTIVE ADHESIVE

CROSS REFERENCE TO RELATED APPLICATIONS

This application is a Continuation of U.S. patent application Ser. No. 16/461,282, filed on May 15, 2019, which was filed as the National Phase of PCT International Application No. PCT/KR2016/015338, filed on Dec. 27, 2016, which claims priority under 35 U.S.C. § 119(a) to Patent Application No. 10-2016-0153501, filed in the Republic of Korea on Nov. 17, 2016, all of these applications are hereby expressly incorporated by reference into the present application.

BACKGROUND OF THE INVENTION

1. Field of the Invention

The present disclosure relates to a display apparatus and a manufacturing method thereof, and more particularly, to a display apparatus using a semiconductor light emitting device.

2. Description of the Conventional Art

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

In a display using the semiconductor light emitting devices, electrical and physical coupling between a wiring board and a semiconductor light emitting device is generally implemented using an anisotropic conductive film (ACF). However, such a method has a disadvantage in that there is a restriction in implementing the transfer of various types of semiconductor light emitting devices and the manufacturing cost is high, since semiconductor light emitting devices corresponding to a region of the anisotropic conductive film are all transferred. Accordingly, the present disclosure proposes a mechanism capable of implementing various transfers while reducing manufacturing cost.

SUMMARY OF THE INVENTION

An object of the present disclosure is to provide a manufacturing method of a display apparatus capable of reducing manufacturing cost.

Another object of the present disclosure is to provide a method of manufacturing a display apparatus capable of transferring red, green, and blue semiconductor light emitting devices to a single wiring board.

Still another object of the present disclosure is to provide a mechanism capable of transferring a large area wafer in a display apparatus.

In a display apparatus according to the present disclosure, a liquid-phase conductive adhesive layer may be coated in a pattern on a wafer to implement various transfers.

For a specific example, the display apparatus may include a wiring board having wiring electrodes, a conductive adhesive layer covering the wiring electrodes, and a plurality of semiconductor light emitting devices coupled to the conductive adhesive layer and electrically connected to the wiring electrodes. The conductive adhesive layer may have a plurality of adhesive regions coated in a patterned shape on each electrode of the semiconductor light emitting devices, and spaced apart from each other on the wiring board.

According to an embodiment, the plurality of adhesive regions may have at least one of an anisotropic conductive adhesive (ACA), a silver paste, a tin paste, and a solder paste. A white pigment may be added to the anisotropic conductive adhesive. An inorganic powder may be added to the anisotropic conductive adhesive.

According to an embodiment, an insulating material may be disposed between the plurality of adhesive regions to fill between the plurality of semiconductor light emitting devices. The insulating material may be formed of a material different from that of the conductive adhesive layer.

In addition, the present disclosure discloses a manufacturing method of a display apparatus, including growing first semiconductor light emitting devices and second semiconductor light emitting devices on a growth substrate, coating a conductive adhesive on the electrodes of the first semiconductor light emitting devices, aligning the first semiconductor light emitting devices on a first wiring board having wiring electrodes, and then removing the growth substrate, coating the conductive adhesive on the electrodes of the second semiconductor light emitting devices, and aligning the second semiconductor light emitting devices on a second wiring board and then removing the growth substrate.

According to an embodiment, the conductive adhesive may be selectively pattern-printed on the growth substrate by at least one of screen printing, dispensing, and liquid-phase pattern transfer.

According to an embodiment, the manufacturing method of the display apparatus may include pattern-printing the conductive adhesive on the growth substrate, and then printing or coating an insulating material on the growth substrate.

Besides, the present disclosure discloses a manufacturing method of a display apparatus, including growing green semiconductor light emitting devices and blue semiconductor light emitting devices separately on a growth substrate such that a light emitting structure of the green semiconductor light emitting device and the blue semiconductor light emitting device is grown, coating a conductive adhesive on an electrode of the green semiconductor light emitting devices or a first portion corresponding to the green semiconductor light emitting devices on a wiring electrode of a wiring board, coupling the green semiconductor light emitting devices to the first portion, and coating the conductive adhesive on an electrode of the blue semiconductor light emitting devices or a second portion corresponding to the blue semiconductor light emitting devices on the wiring electrode, and coupling the blue semiconductor light emitting devices to the second portion.

According to an embodiment, the manufacturing method of the display apparatus may include aligning the growth substrate of the green semiconductor light emitting devices with another wiring board, and transferring the green semiconductor light emitting devices to the another wiring board.

In said transferring step, the semiconductor light emitting device that has been coupled to the another wiring board may be aligned at a portion where the green semiconductor light emitting device is not present by coupling the green semiconductor light emitting devices to the first portion.

According to an embodiment, the manufacturing method of the display apparatus may include providing red semiconductor light emitting devices on a separate substrate, and coating the conductive adhesive on an electrode of the red semiconductor light emitting devices or a third portion corresponding to the red semiconductor light emitting devices on the wiring electrode, and coupling the red semiconductor light emitting devices to the third portion.

In a display apparatus according to the present disclosure, semiconductor light emitting devices may be transferred in a desired pattern since a liquid-phase conductive adhesive is partially printed on a wafer or a wiring board, thereby implementing a manufacturing method with a very wide range of application fields.

Furthermore, according to the present disclosure, a display apparatus having semiconductor light emitting devices may be manufactured without a photo-lithographic process, and accordingly, the manufacturing process is simple and inexpensive.

In addition, according to the present disclosure, partial transfer may be allowed on a large area wafer, and accordingly, red, green, and blue semiconductor light emitting devices may be transferred onto a single wiring board.

Moreover, according to the present disclosure, it is possible to perform multiple transfers on a single wafer, thereby reducing the manufacturing cost and allowing wafer transfer of semiconductor light emitting devices to a large area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
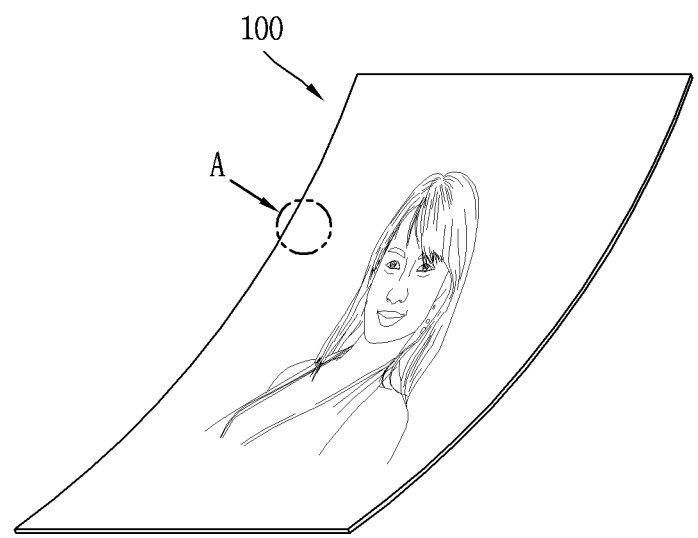
FIG. 1 is a conceptual view showing a display apparatus using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display apparatus using a semiconductor light emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
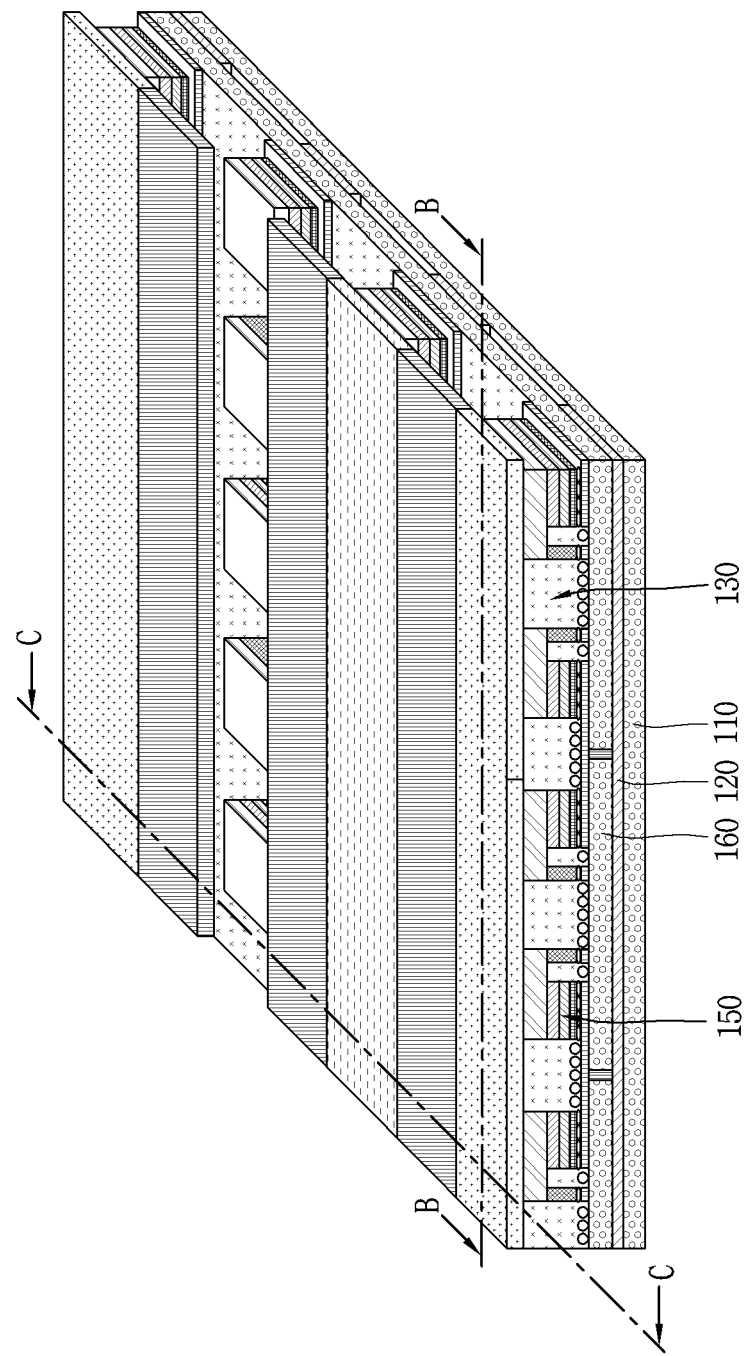
FIG. 2 is a partial enlarged view of portion "A" in FIG. 1, and FIGS. 3A and 3B are cross-sectional views taken along lines B-B and C-C in FIG. 2.
Figure 3A:
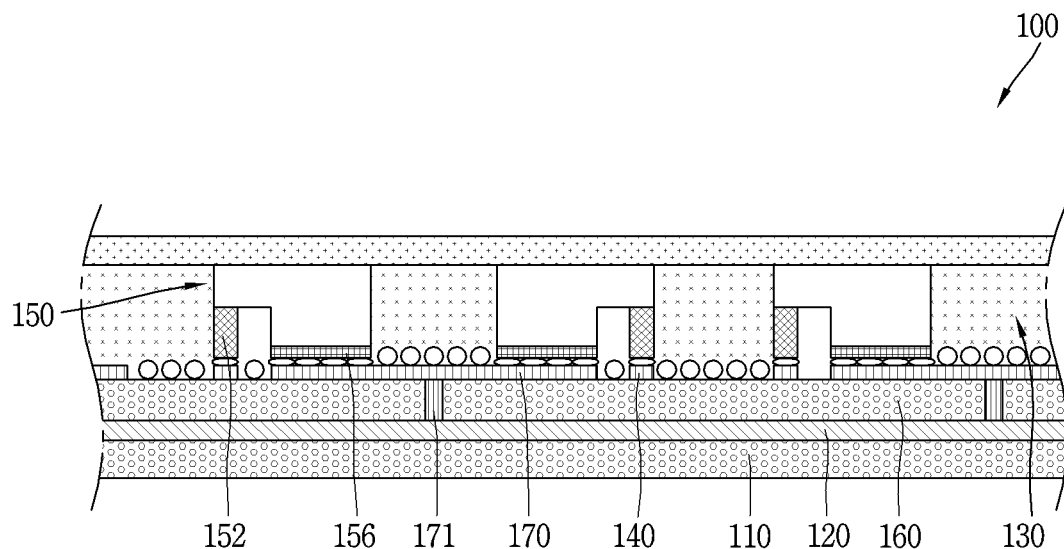
Figure 3B:
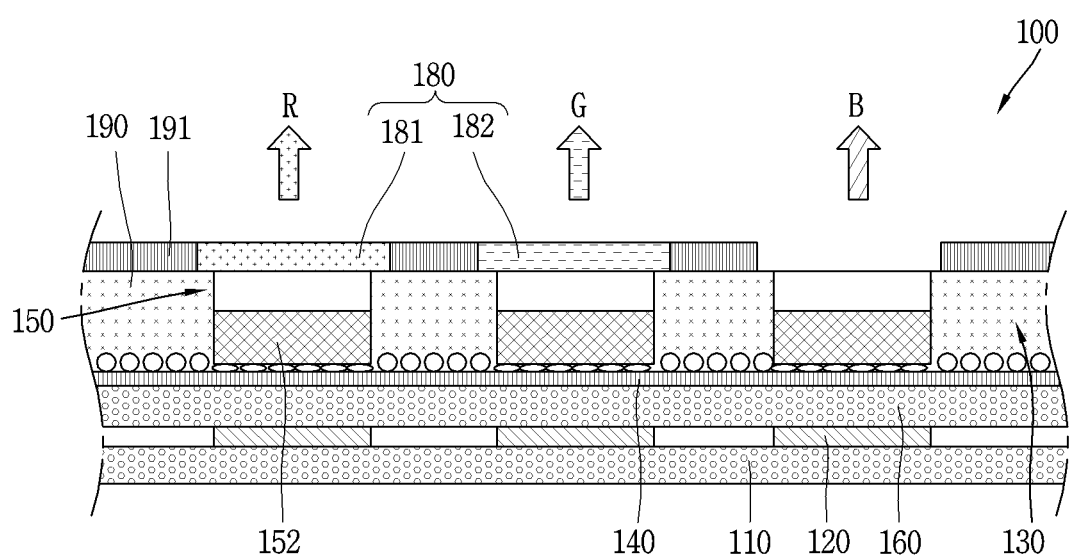
Figure 4:
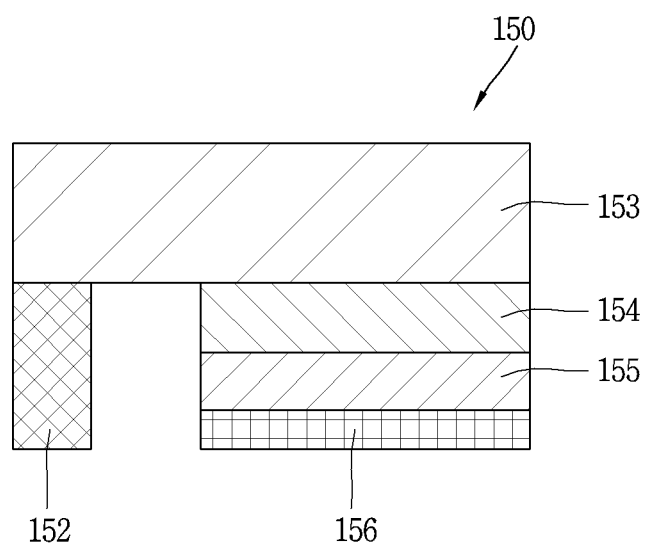
FIG. 4 is a conceptual view showing a flip chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display apparatus 100 using a passive matrix (PM) type semiconductor light emitting device as a display apparatus 100 using a semiconductor light emitting device. However, an example described below may also be applicable to an active matrix (AM) type semiconductor light emitting device.

The display apparatus 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display apparatus. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring board disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring board. More specifically, the insulating layer 160 may be incorporated into the substrate 110 with an insulating and flexible material such as polyimide (PI), PET, PEN or the like to form single wiring board.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self-luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
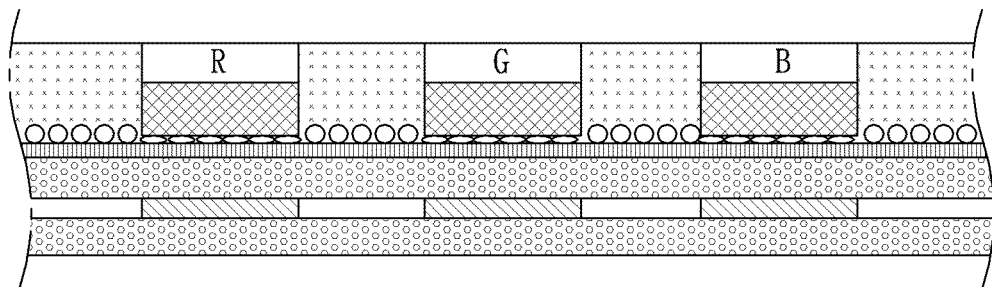
FIGS. 5A through 5C are conceptual views showing various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
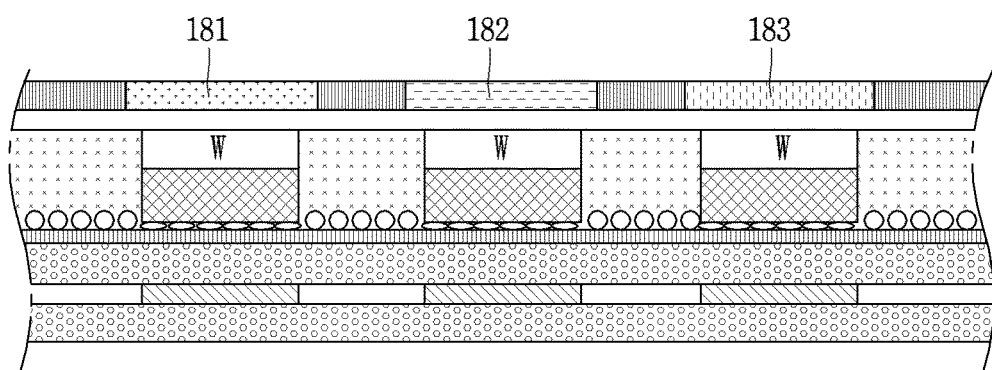

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
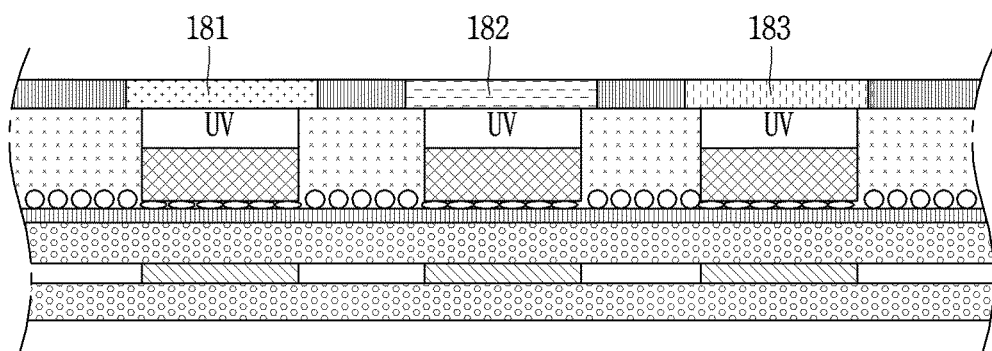

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display apparatus. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display apparatus having a HD image quality.

A display apparatus using the foregoing semiconductor light emitting device will be manufactured by a new type of manufacturing method. Hereinafter, the manufacturing method will be described with reference to FIG. 6.

Figure 6:
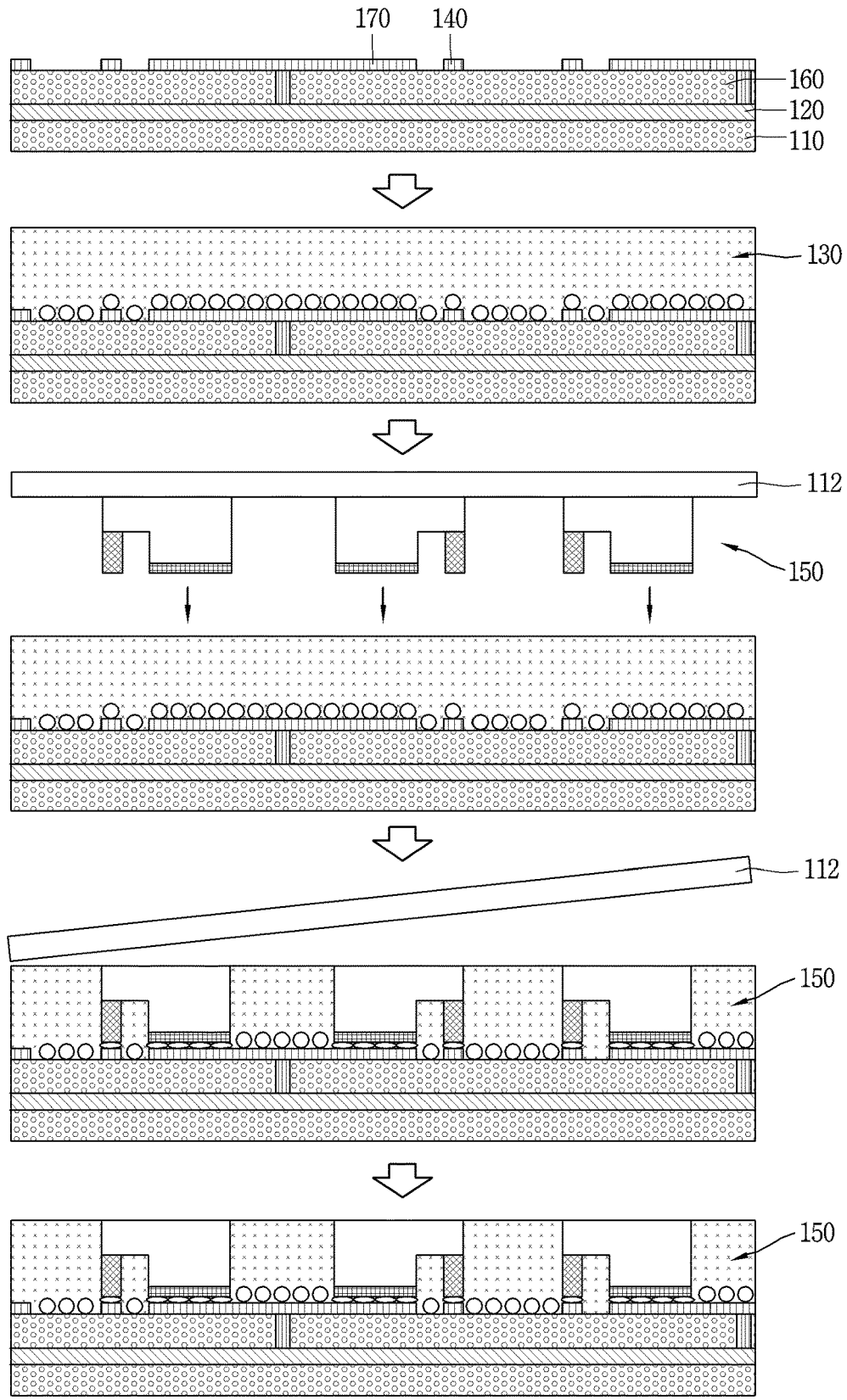
FIG. 6 is cross-sectional views showing a manufacturing method of a display apparatus using a semiconductor light emitting device according to the present disclosure.

FIG. 6 is cross-sectional views illustrating a manufacturing method of a display apparatus using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring board), and the first electrode 120, auxiliary electrode 170 and second electrode 140 are disposed at the wiring board. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display apparatus when formed in the unit of wafer, and thus effectively used for a display apparatus.

Next, the wiring board is thermally compressed to the second substrate 112. For example, the wiring board and second substrate 112 may be thermally compressed to each other by applying an ACF press head. The wiring board and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring board coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The manufacturing method or structure of a display apparatus using the foregoing semiconductor light emitting device may be modified in various forms. For such an example, the foregoing display apparatus may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
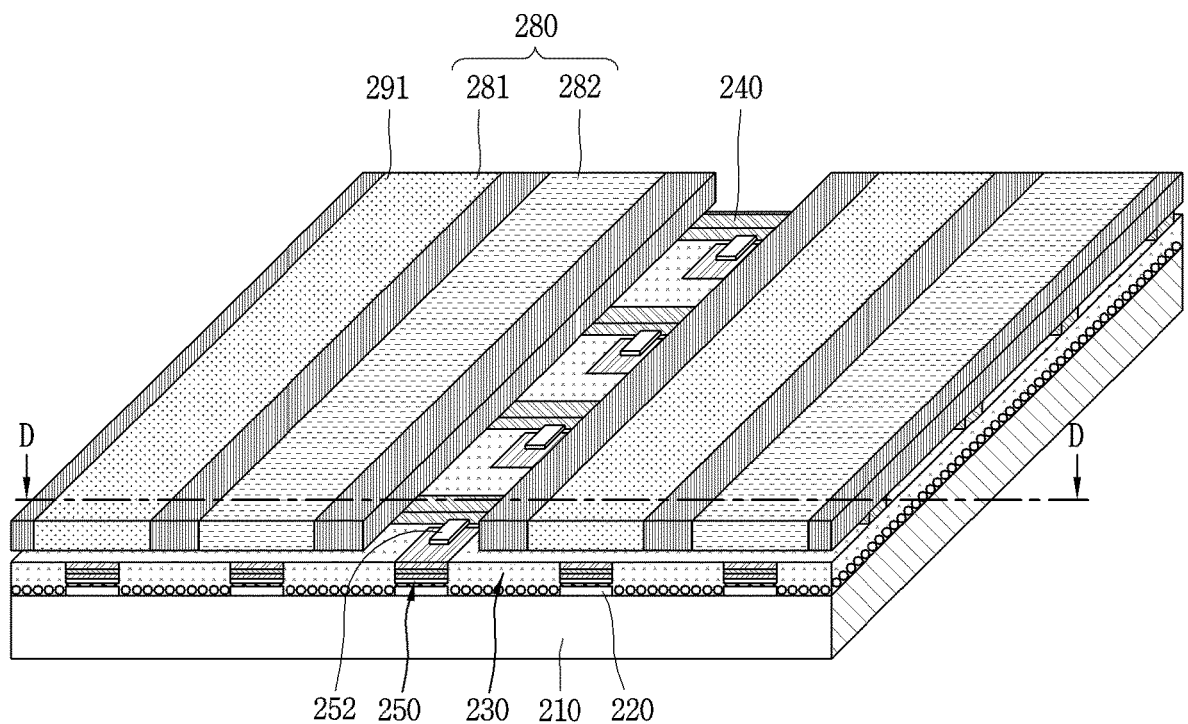
FIG. 7 is a perspective view showing a display apparatus using a semiconductor light emitting device according to another embodiment of the present disclosure.
Figure 8:
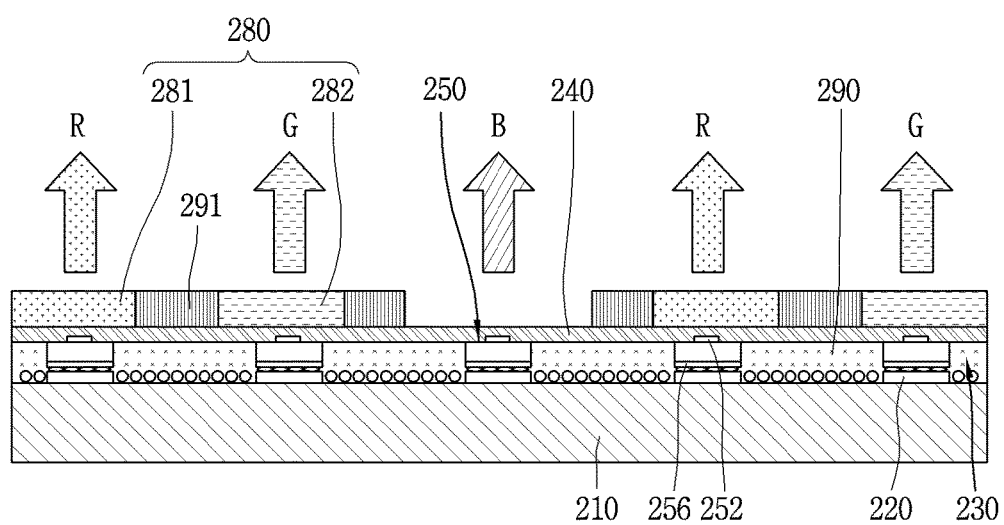
FIG. 8 is a cross-sectional view taken along line D-D in FIG. 7.
Figure 9:
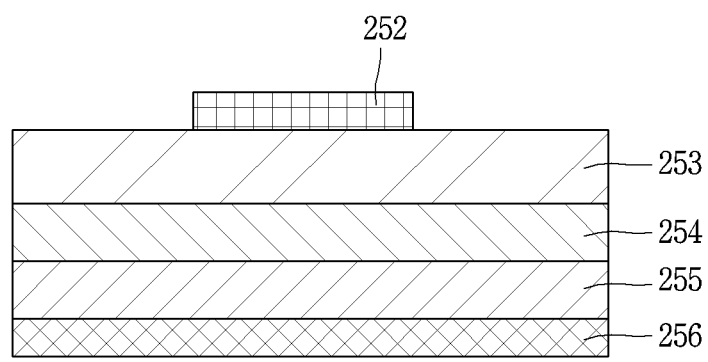
FIG. 9 is a conceptual view illustrating a vertical type semiconductor light emitting device in FIG. 8.

FIG. 7 is a perspective view illustrating a display apparatus using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display apparatus may be display apparatus using a passive matrix (PM) type of vertical semiconductor light emitting device.

The display apparatus may include a substrate 210, a first electrode 220, a conductive adhesive layer 230, a second electrode 240 and a plurality of semiconductor light emitting devices 250.

The substrate 210 as a wiring board disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display apparatus to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display apparatus. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display apparatus.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display apparatus. The semiconductor light emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting device.

In a display apparatus using the foregoing semiconductor light emitting device of the present disclosure, when a flip chip type is applied thereto, the first and second electrodes are disposed on the same plane, thereby causing a problem in which it is difficult to realize a fine pitch. Hereinafter, a display apparatus to which a flip chip type light emitting device according to another embodiment of the present disclosure capable of solving such a problem is applied will be described.

Figure 10:
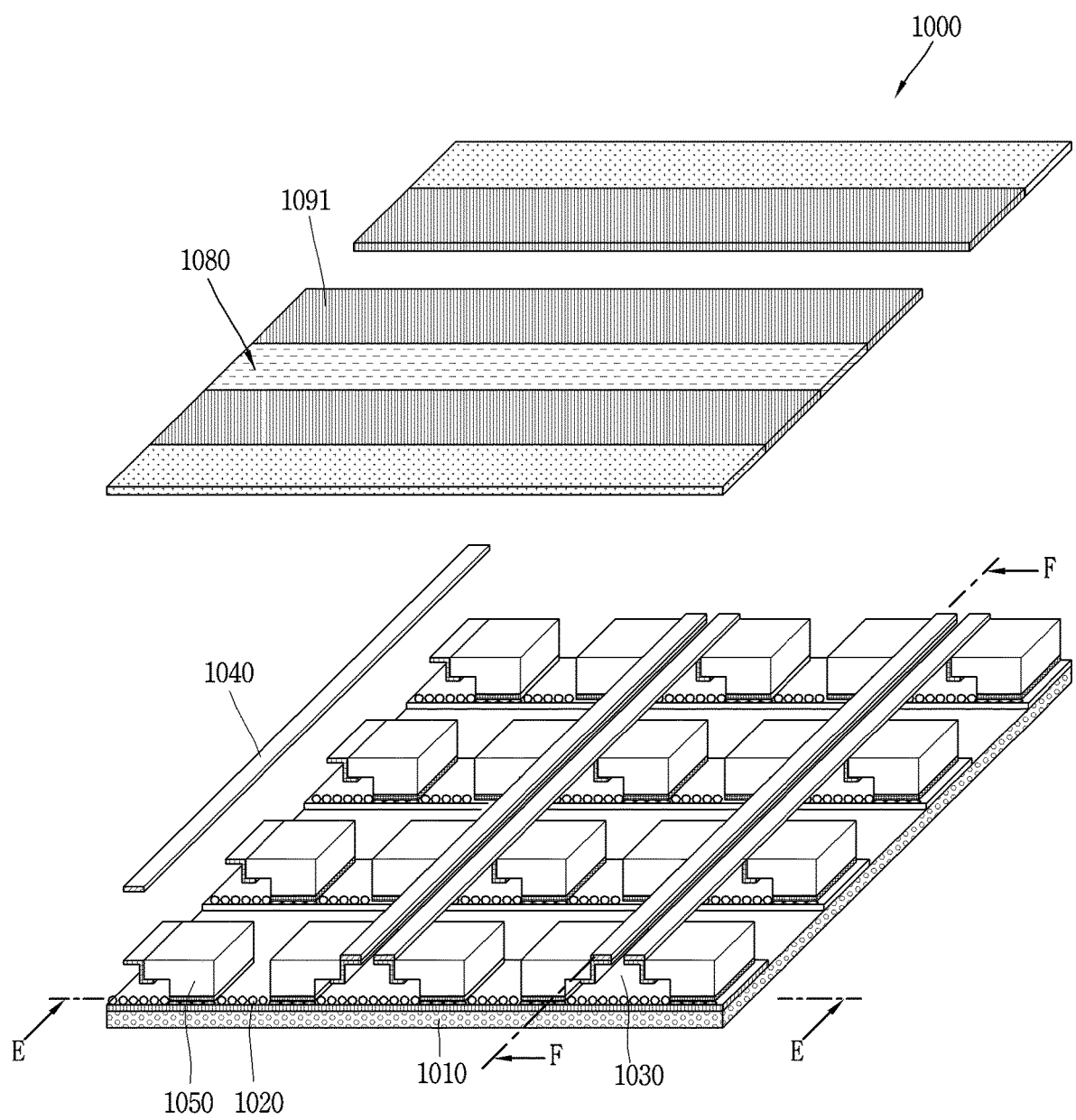
FIG. 10 is an enlarged view of portion "A" in FIG. 1 for explaining another embodiment of the present disclosure to which a semiconductor light emitting element having a new structure is applied.
Figure 11A:
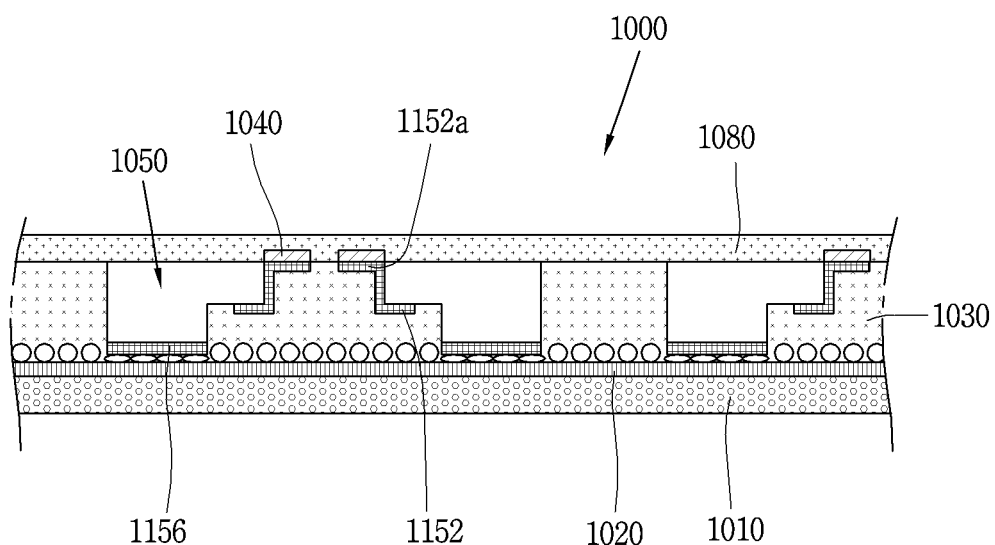
FIG. 11A is a cross-sectional view taken along line E-E in FIG. 10.
Figure 11B:
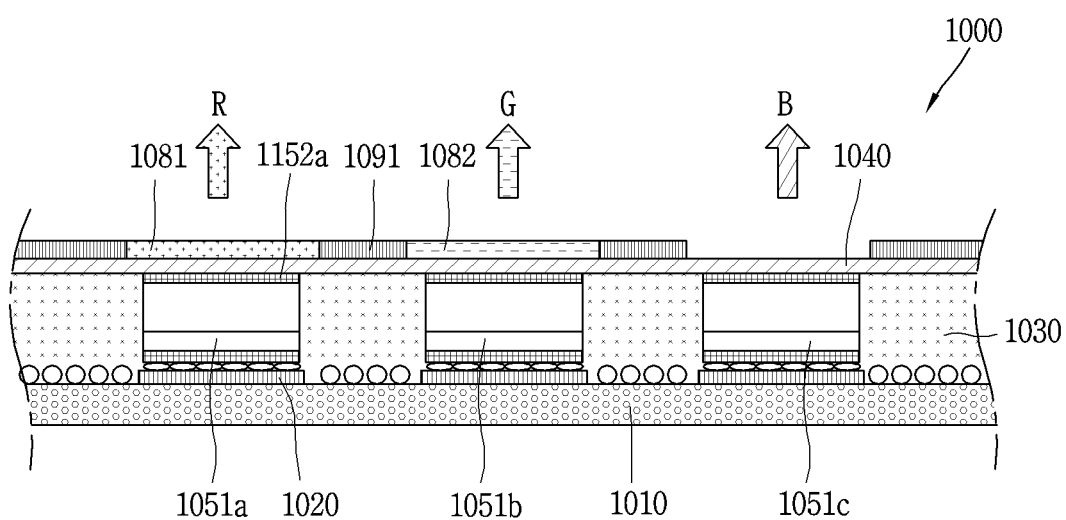
FIG. 11B is a cross-sectional view taken along line F-F in FIG. 11.
Figure 12:
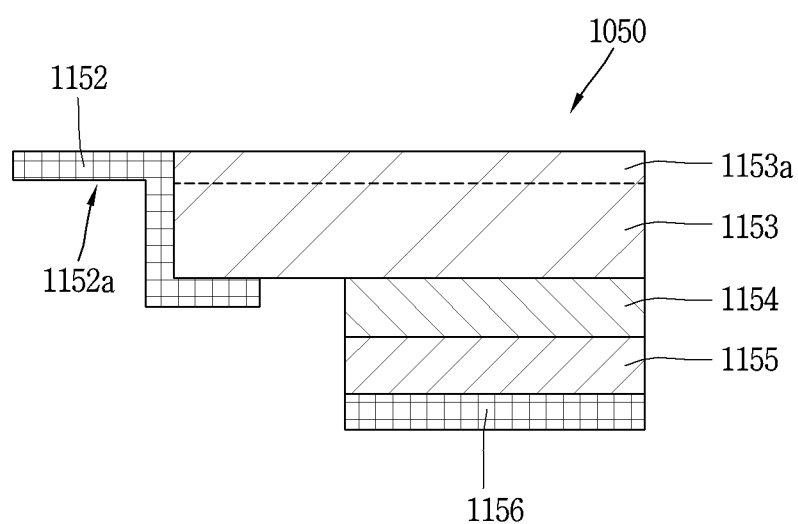
FIG. 12 is a conceptual view illustrating a flip chip type semiconductor light emitting device in FIG. 11A.

FIG. 10 is an enlarged view of portion "A" in FIG. 1 for explaining another embodiment of the present disclosure to which a semiconductor light emitting device having a new structure is applied, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light emitting device in FIG. 11A.

According to the drawings in FIGS. 10, 11A and 11B, there is illustrated a display apparatus 1000 using a passive matrix (PM) type semiconductor light emitting device as a display apparatus 1000 using a semiconductor light emitting device. However, an example described below may also be applicable to an active matrix (AM) type semiconductor light emitting device.

The display apparatus 1000 may include a substrate 1010, a first electrode 1020, a conductive adhesive layer, a second electrode 1040, and a plurality of semiconductor light emitting devices 1050. Here, the first electrode 1020 and the second electrode 1040 may respectively include a plurality of electrode lines.

The substrate 1010 as a wiring board disposed with the first electrode 1020 may include polyimide (PI) to implement a flexible display apparatus. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer is formed on the substrate 1010 located with the first electrode 1020. Similar to a display apparatus to which the foregoing flip chip type light emitting device is applied, the conductive adhesive layer may be an anisotropic conductive film (ACF) 1030.

A plurality of second electrodes 1040 disposed in a direction of crossing the length direction of the first electrode 1020, and electrically connected to the semiconductor light emitting device 1050 may be located between the semiconductor light emitting devices.

According to the drawing, the second electrode 1040 may be located on the anisotropic adhesive layer 1030. In other words, the anisotropic conductive film 1030 is disposed between the wiring board and the second electrode 1040. The second electrode 1040 may be electrically connected by contact with the semiconductor light emitting device 1050.

A plurality of semiconductor light emitting devices 1050 are coupled to the anisotropic conductive film 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the anisotropic conductive film 1030 or transparent insulating layer.

As shown in the drawing, the plurality of semiconductor light emitting devices 1050 may form a plurality of columns in a direction parallel to a plurality of electrode lines provided in the first electrode 1020. However, the present disclosure is not necessarily limited thereto. For example, the plurality of semiconductor light emitting devices 1050 may form a plurality of columns along the second electrode 1040.

Moreover, the display apparatus 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a location implementing a red sub-pixel, and a green phosphor 1082 capable of converting blue light into green (G) light may be deposited on the blue semiconductor light emitting device 1051b at a location implementing a green sub-pixel. Furthermore, only the blue semiconductor light emitting device 1051c may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light emitting device 1050 may be combined with a quantum dot (QD) instead of a phosphor to implement sub-pixels that emit red (R), green (G) and blue (B).

On the other hand, in order to improve the contrast of the phosphor layer 1080, the display apparatus may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light emitting device 1051, but the black matrix 1091 may be respectively formed at both sides thereof with a space that does not have the blue light emitting device 1051c therebetween.

Meanwhile, referring to the semiconductor light emitting device 1050 according to the present example, the electrodes may be disposed in an upward/downward direction in the semiconductor light emitting device 1050 in the present embodiment, thereby having a great advantage capable of reducing the chip size. However, the electrode may be disposed on the top and the bottom, but the semiconductor light emitting device may be a flip chip type semiconductor light emitting device.

Referring to FIG. 12, the semiconductor light emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153*a* is formed on the other surface of the second conductive semiconductor layer 1153.

Referring to FIG. 12 together with FIGS. 10 through 11B, one surface of the second conductive semiconductor layer may be a surface closest to the wiring board, and the other surface of the second conductive semiconductor layer may be a surface farthest from the wiring board.

Furthermore, the first conductive electrode 1156 and the second conductive electrode 1152 may have a height difference from each other in width and vertical directions (or thickness direction) at positions spaced apart along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may protrude from a side surface of the second conductive semiconductor layer 1153 (or a side surface of the undoped semiconductor layer 1153*a*). As described above, since the second conductive electrode 1152 protrudes from the side surface, the second conductive electrode 1152 may be exposed to an upper side of the semiconductor light emitting device. Through this, the second conductive electrode 1152 is disposed at a position overlapping the second electrode 1040 disposed at an upper side of the anisotropic conductive film 1030.

More specifically, the semiconductor light emitting device includes a protruding portion 1152*a* extending from the second conductive electrode 1152, and protruding from a side surface of the plurality of semiconductor light emitting devices. In this case, referring to the protruding portion 1152*a* as a reference, the first conductive electrode 1156 and the second conductive electrode 1152 are disposed at positions spaced apart along the protruding direction of the protruding portion 1152*a*, and may be expressed such that they are formed to have a height difference from each other in a direction perpendicular to the protruding direction.

The protruding portion 1152*a* extends laterally from one surface of the second conductive semiconductor layer 1153, and extends to an upper surface of the second conductive semiconductor layer 1153, and more specifically, to the undoped semiconductor layer 1153*a*. The protruding portion 1152*a* protrudes along the width direction from a side surface of the undoped semiconductor layer 1153*a*. Accordingly, the protruding portion 1152*a* may be electrically connected to the second electrode 1040 on the opposite side of the first conductive electrode with respect to the second conductive semiconductor layer.

A structure including the protruding portion 1152*a* may be a structure capable of using the above-described horizontal semiconductor light emitting device and vertical semiconductor light emitting device. On the other hand, fine grooves may be formed by roughing on an upper surface farthest from the first conductive electrode 1156 on the undoped semiconductor layer 1153*a*.

According to the display apparatus described above, since the anisotropic conductive film 1030 is formed as a single film or entirely coated on the wiring board, the transfer of a semiconductor light emitting device is carried out once on a wafer.

Accordingly, the present disclosure proposes a manufacturing method and structure capable of transferring semiconductor light emitting devices a plurality of times, thereby implementing a reduction in the transfer and manufacturing cost of a large area. Hereinafter, the manufacturing method and structure of the present disclosure will be described in detail with reference to the drawings. In an example described below, a semiconductor light emitting device will be described based on the semiconductor light emitting device described above with reference to FIGS. 10 through 12.

Figure 13A:
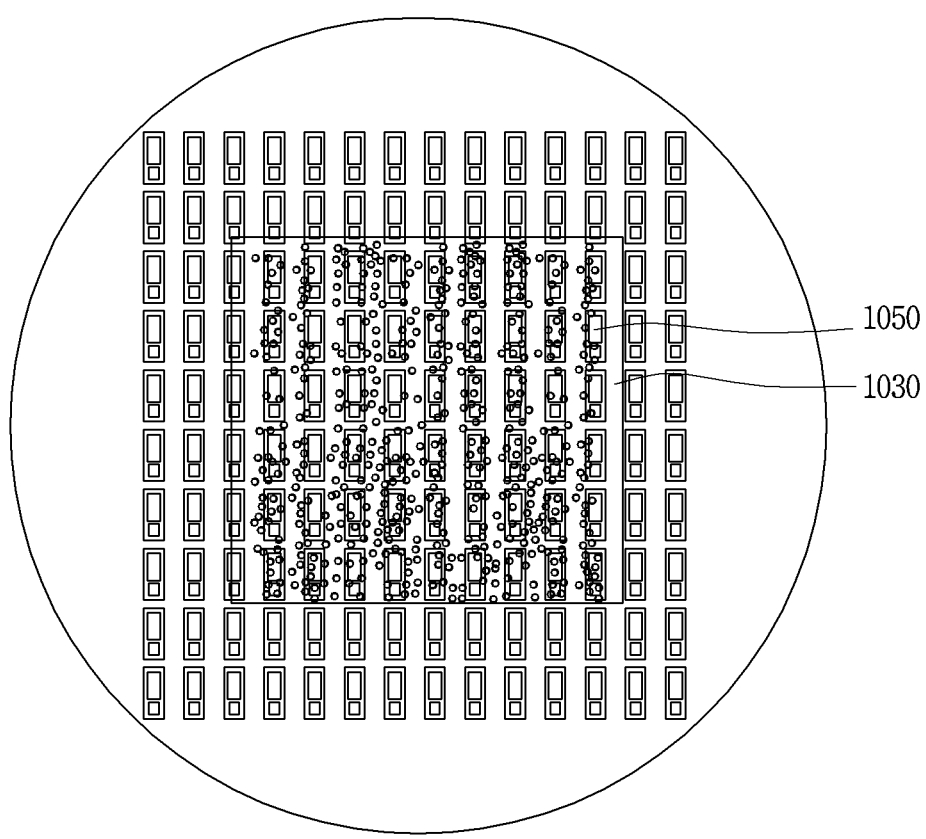
FIGS. 13A and 13B are conceptual views showing a case where an anisotropic conductive film is attached and a case where a plurality of adhesive regions are patterned on a wafer with semiconductor light emitting devices.
Figure 13B:
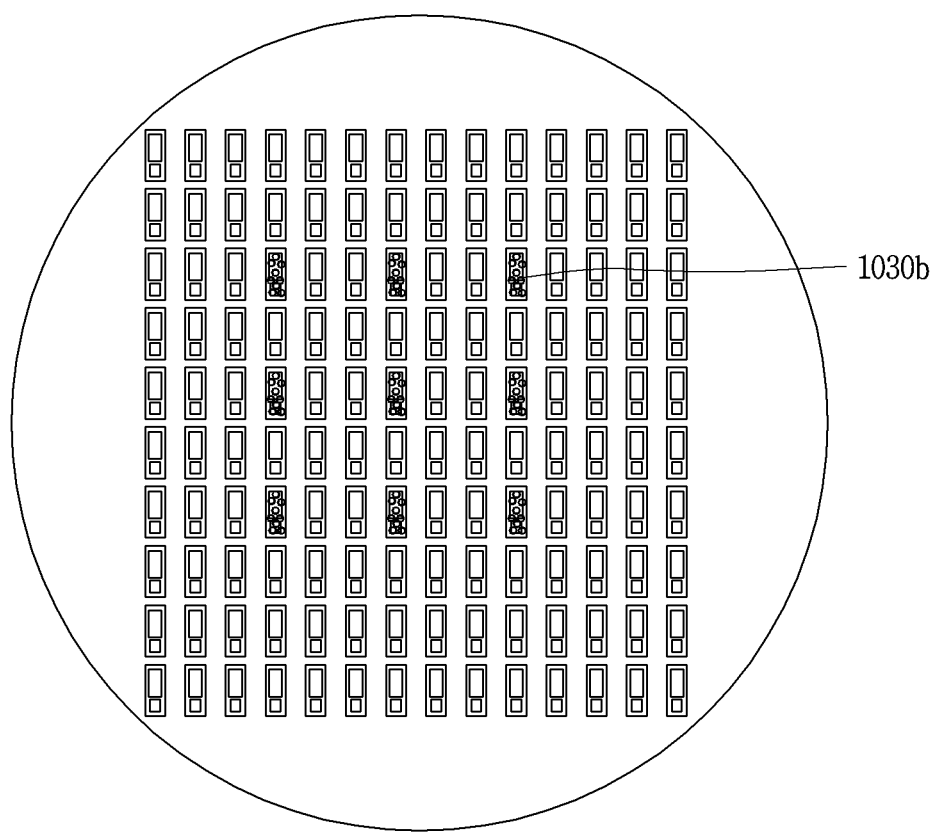
Figure 14A:
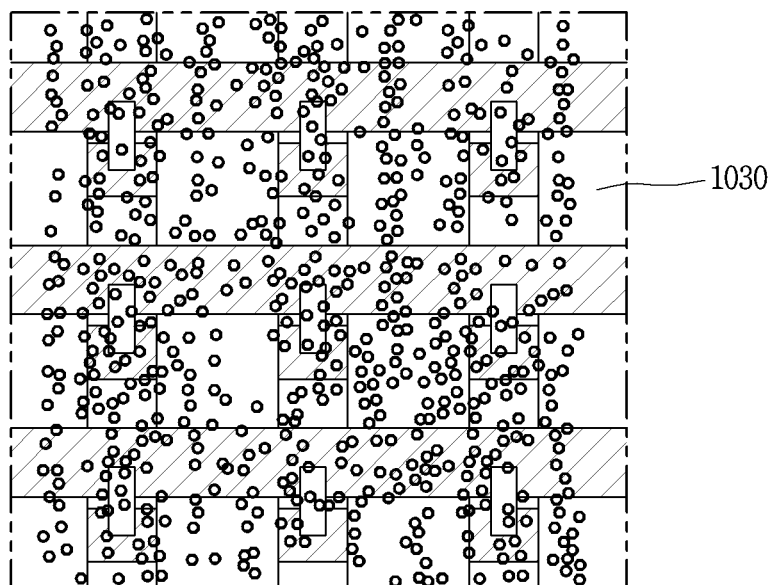
FIGS. 14A and 14B are conceptual views showing a case where an anisotropic conductive film is attached and a case where a plurality of adhesive regions are patterned on a wiring board.
Figure 14B:
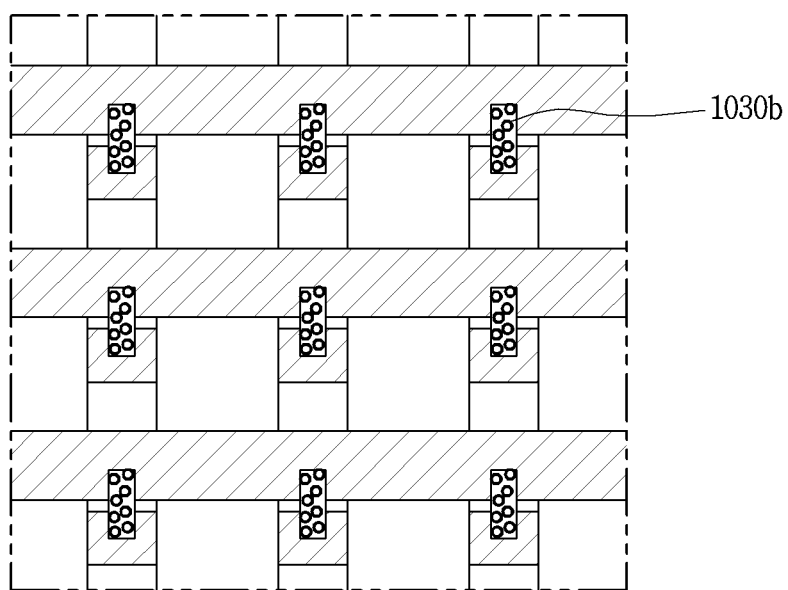

FIGS. 13A and 13B are conceptual views showing a case where an anisotropic conductive film is attached and a case where a plurality of adhesive regions are patterned on a wafer with semiconductor light emitting devices, and FIGS. 14A and 14B are conceptual views showing a case where an anisotropic conductive film is attached and a case where a plurality of adhesive regions are patterned on a wiring board.

According to FIG. 13A, a plurality of semiconductor light emitting devices 1050 are spaced apart at a predetermined interval on a single wafer substrate, and an anisotropic conductive film 1030 is bonded to cover a specific region on the wafer substrate. At this time, a single sheet of anisotropic conductive film 1030 may be bonded to a single area on the wafer substrate, or several sheets of anisotropic conductive film 1030 may be bonded to the single area in a divided manner. In this case, the single region, as a region including a space between the semiconductor light emitting devices, may be a region formed without being disconnected.

When thermo-compression bonding to the wiring board is carried out in this state, semiconductor light emitting devices in the single region are transferred to the wiring board. Referring to FIG. 14A, the anisotropic conductive film 1030 covers wiring electrodes and between the wiring electrodes on a wiring board, and through this, bonding between the wiring board and semiconductor light emitting devices on a wafer is carried out.

As described above, according to the structure in which the anisotropic conductive film 1030 is bonded to the wafer or the wiring board, semiconductor light emitting devices on the wafer may be transferred once, thereby causing the constraint of size and difficulty in using non-transferred semiconductor light emitting devices.

In order to solve such a problem, in FIG. 13B, a plurality of adhesive regions 1030*b* are patterned on the wafer. For example, a liquid-phase anisotropic conductive adhesive (ACA) may be pattern-printed on the wafer. The anisotropic conductive adhesive may be an anisotropic conductive paste (ACP) as a paste type adhesive. For another example, at least one of silver paste, tin paste, and solder paste may be pattern-printed on the wafer. In this case, the silver paste, tin paste and solder paste may replace the anisotropic conductive adhesive.

As shown in FIG. 13B, the anisotropic conductive adhesive is coated in a liquid phase in a predetermined pattern onto the electrodes of the semiconductor light emitting device through a method such as a printing process (screen printing), a dispensing process, a liquid phase pattern transfer, or the like. For such an example, in a region covered by the anisotropic conductive film in FIG. 13A, coating and non-coating may be sequentially carried out along one direction for the printing of the anisotropic conductive adhesive in FIG. 13B.

Referring to FIG. 14B, a plurality of adhesive regions 1030*b* covering part of the wiring electrodes are provided, and these are sequentially arranged at a preset spacing distance. In this case, the resin of the anisotropic conductive adhesive may flow out into a space (S) formed between the plurality of adhesive regions 1030*b*. In FIG. 13B, the semiconductor light emitting device on which the anisotropic conductive adhesive is not coated may be coated with the anisotropic conductive adhesive and transferred to the wiring board at the time of manufacturing another display apparatus. Therefore, the semiconductor light emitting devices grown on a large area wafer may be transferred a plurality of times.

Figure 15:
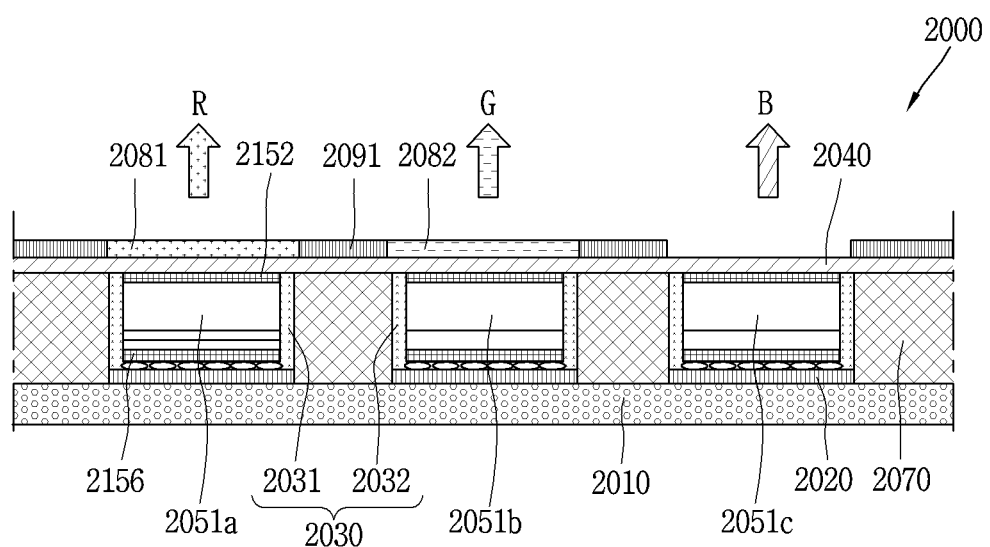
FIG. 15 is a cross-sectional view showing an embodiment of a display apparatus when a plurality of adhesive regions are patterned.

Hereinafter, the structure of a display apparatus of the present disclosure will be described in detail with reference to the accompanying drawings. FIG. 15 is a cross-sectional view showing an embodiment of a display apparatus when a plurality of adhesive regions are patterned.

According to the drawing of FIG. 15, as a display apparatus using semiconductor light emitting devices, there is illustrated a display apparatus 2000 using flip chip type semiconductor light emitting devices described with reference to FIGS. 10 through 12. More specifically, there is illustrated a case in which a new phosphor layer structure is applied to a flip chip type semiconductor light emitting device described with reference to FIGS. 10 through 12. However, an example described below is also applicable to a display apparatus using another type of semiconductor light emitting device described above.

In the present example to be described below, the same or similar reference numerals are designated to the same or similar components as those of the example described above with reference to FIGS. 10 through 12, and the description thereof will be substituted by the earlier description. For example, the display apparatus 2000 includes a substrate 2010, a first electrode 2020, a second electrode 2040, and a plurality of semiconductor light emitting devices 2050, and the descriptions thereof will be substituted by the description with reference to FIGS. 10 through 12 as described above.

The substrate 2010 is a wiring board having wiring electrodes, and the first electrode 2020 may be a wiring electrode located on the substrate 2010, and formed with a bar-shaped electrode elongated in one direction. The first electrode 2020 may be formed to perform the role of a data electrode.

A plurality of second electrodes 2040 disposed in a direction of crossing the length direction of the first electrode 2020, and electrically connected to the semiconductor light emitting device 2050 may be located between the semiconductor light emitting devices.

As shown in the drawing, the plurality of semiconductor light emitting devices 2050 may form a plurality of columns in a direction parallel to a plurality of electrode lines provided in the first electrode 2020. However, the present disclosure is not necessarily limited thereto. For example, the plurality of semiconductor light emitting devices 2050 may form a plurality of columns along the second electrode 2040.

According to the illustration, the substrate 2010 is covered by the conductive adhesive layer 2030. In addition, the plurality of semiconductor light emitting devices 2050 are coupled to the conductive adhesive layer 2030, and electrically connected to the wiring electrodes.

The conductive adhesive layer is formed on the substrate 2010 at a position corresponding to the first electrode 2020. For example, the conductive adhesive layer 2030 may have a plurality of adhesive regions 2031, 2032 that are coated in a patterned shape on each electrode of the semiconductor light emitting devices, and are spaced apart from each other on the wiring board.

A plurality of semiconductor light emitting devices 2050 are coupled to the conductive adhesive layer 2030, and electrically connected to the first electrode 2020 and the second electrode 2040 by the foregoing structure.

More specifically, individual adhesion regions of the plurality of adhesive regions 2031, 2032 are disposed between the first electrode 2020 and the first conductive electrode 2156 of the semiconductor light emitting device. At this time, the first conductive electrode 2156 may be a p-type electrode.

Each of the adhesive regions 2031, 2032 may have a size capable of surrounding a side surface of the wiring board and surrounding a side surface of the semiconductor light emitting device. For an example, a width of the adhesive region may be 1 to 1.5 times larger than that of the first electrode 2020.

In this case, an insulating material 2070 may be disposed between the plurality of adhesive regions 2031, 2032 to fill a space between the plurality of semiconductor light emitting devices.

The insulating material 2070 may be formed of a material different from the conductive adhesive layer. For such an example, the insulating material 2070 may be formed of a light-transmitting material such as silicon oxide (SiOx), polymer, or the like, and in this case, the insulating material 2070 may have a transmittance of 80% or more in a wavelength range within visible light.

For another example, the insulating material 2070 may be formed of a material having a property of reflecting light, or may be formed of a material having adhesiveness. In micro-unit semiconductor light emitting devices, since each of the devices is isolated, when the insulating material 2070 reflects light escaping from a side surface of the device to the outside, an increase in light extraction efficiency may be expected.

At this time, the insulating material 2070 may be formed in a direction parallel to a plurality of electrode lines provided in the first electrode 1020. Thus, the insulating material 2070 forms a plurality of lines spaced apart from each other.

Meanwhile, the insulating material 2070 may be formed to extend in the same direction as the first conductive electrode 2156. For example, the first conductive electrode 2156 may be formed in a bar shape (line shape) similar to the first electrode. More specifically, the first conductive electrode 2156 may be extended toward an adjacent semiconductor light emitting device to be a common electrode of neighboring semiconductor light emitting devices, and the insulating material 2070 may be formed in parallel to the semiconductor light emitting device.

Meanwhile, the plurality of adhesive regions may include at least one of an anisotropic conductive adhesive (ACA), a silver paste, a tin paste, and a solder paste.

In the case of the anisotropic conductive adhesive, a paste-shaped adhesive having anisotropic conductivity is cured to form the adhesive region. The anisotropic conductive adhesive may include a binder, an epoxy resin, a curing agent, and a conductive ball. In addition, a filler, a coupling agent, and a solvent may be further included in the anisotropic conductive adhesive.

In addition, a white pigment may be added to the anisotropic conductive adhesive to reflect light escaping to the outside between the semiconductor light emitting device and the wiring board. Moreover, an inorganic powder may be added to the anisotropic conductive adhesive, thereby increasing thixotropy and improving printing property. In addition, a reactive solvent may be added to the anisotropic conductive adhesive for a B-stage process for ensuring post-printing processability.

According to the structure described above, a liquid-phase conductive adhesive may be partially printed on a wafer or a wiring board, thereby transferring semiconductor light emitting devices in a desired pattern, and accordingly, a manufacturing method with a very wide range of application fields may be implemented.

Hereinafter, a manufacturing method applied to the present disclosure will be described with reference to the drawings.

Figure 16:
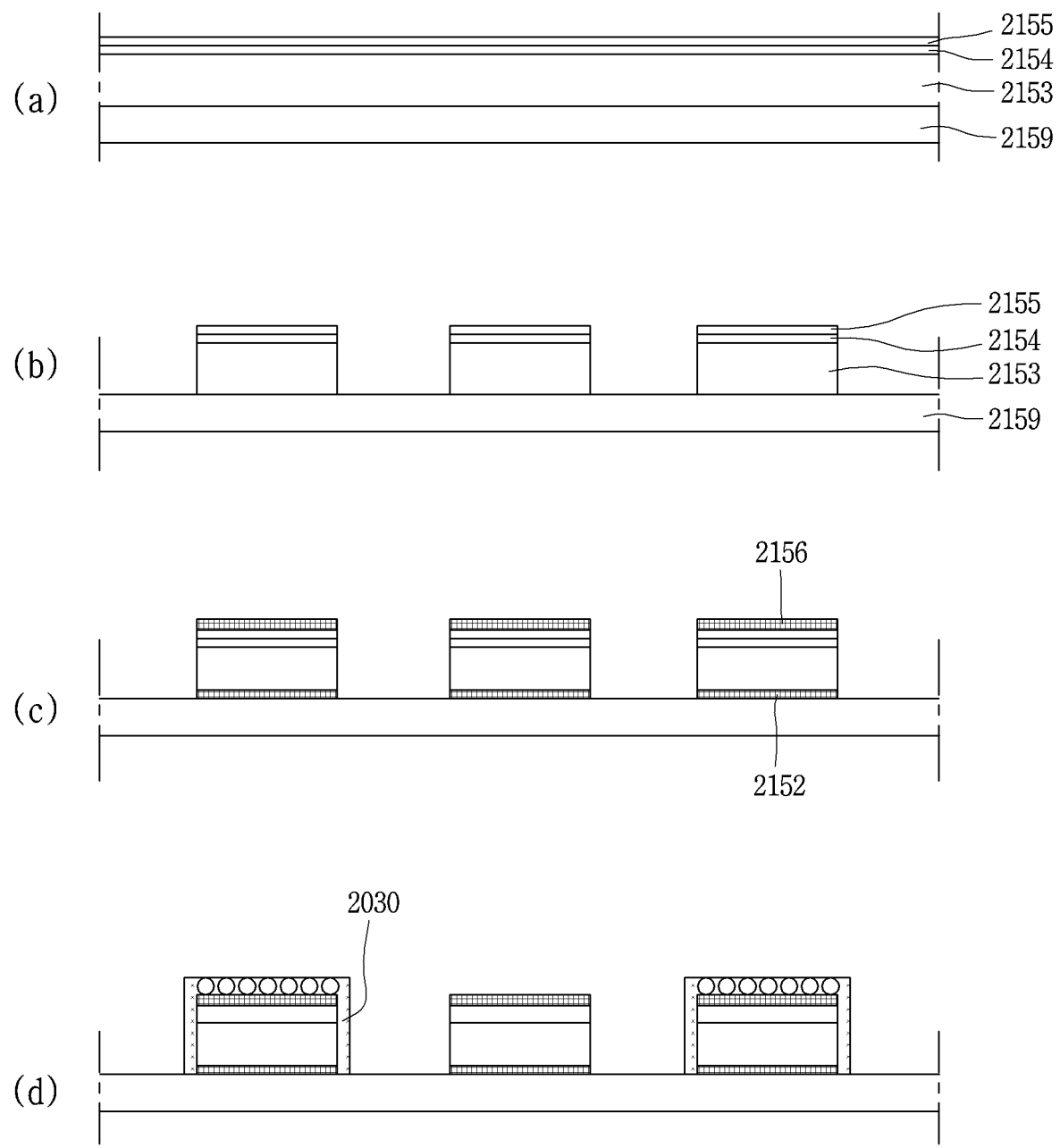
FIGS. 16, 17 and 18 are cross-sectional views showing a manufacturing method of a display apparatus using semiconductor light emitting devices according to the present disclosure.
Figure 17:
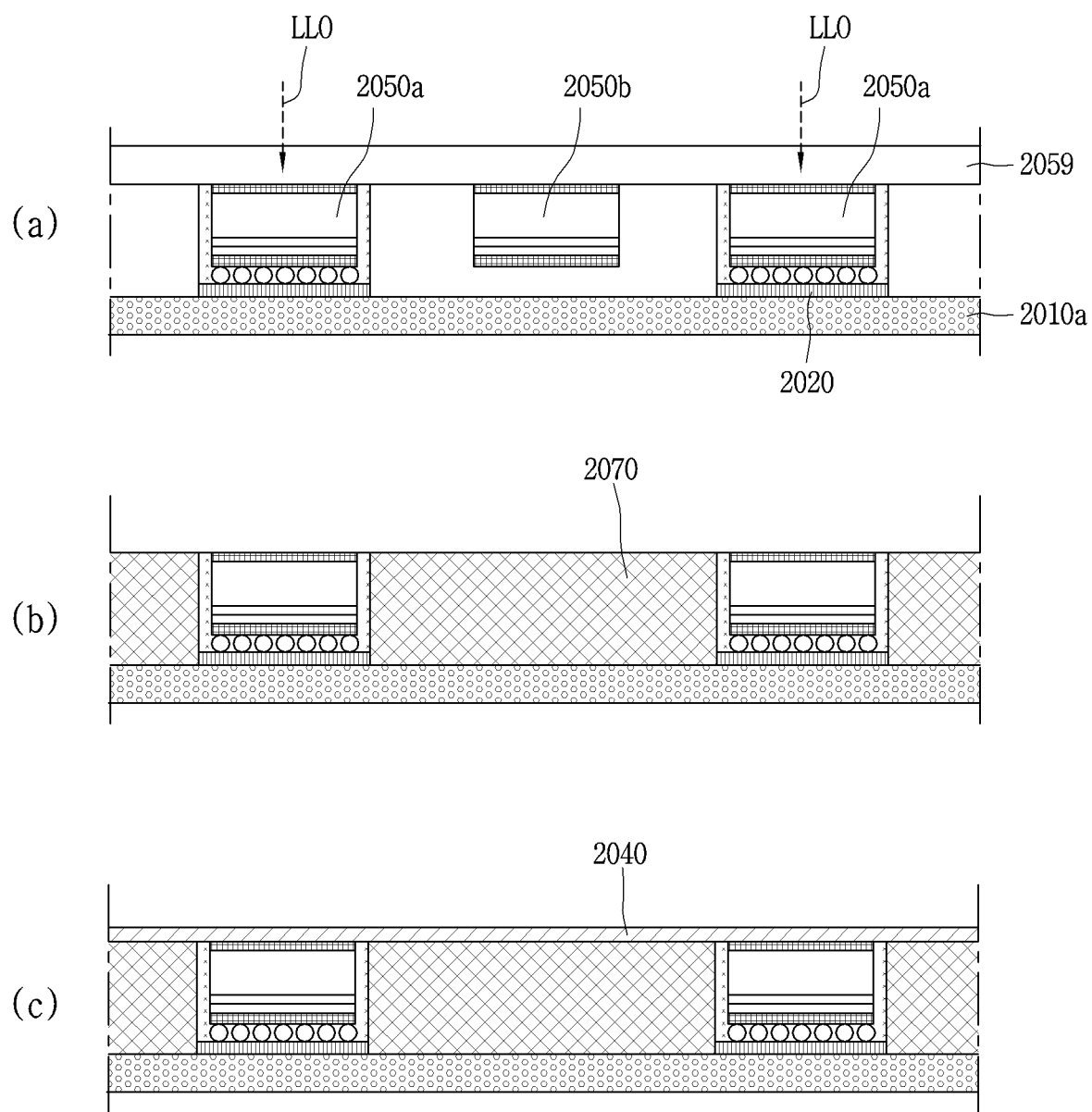
Figure 18:
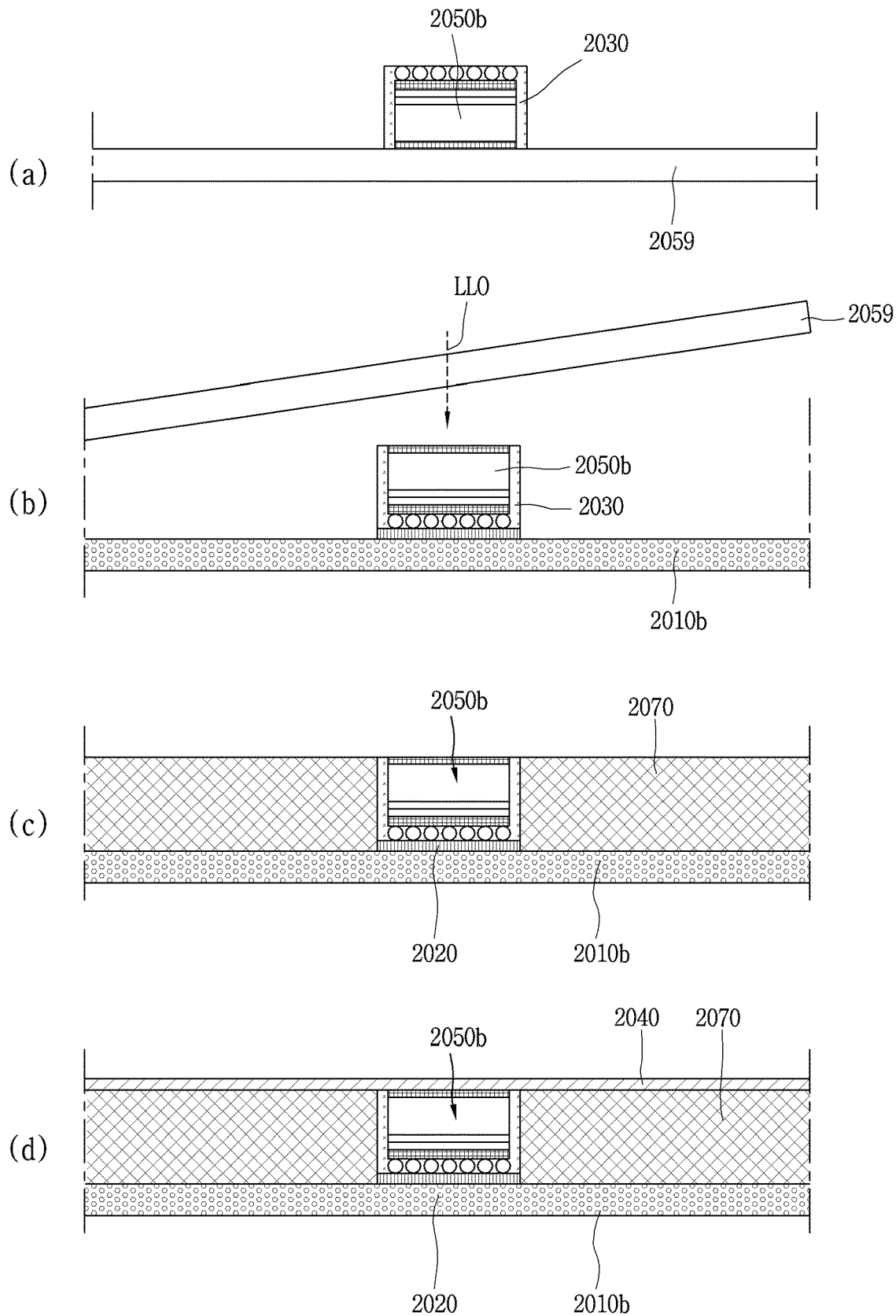

FIGS. 16, 17 and 18 are cross-sectional views showing a manufacturing method of a display apparatus using semiconductor light emitting devices according to the present disclosure.

First, according to the manufacturing method, an n-type semiconductor layer 2153, an active layer 2154, and a p-type semiconductor layer 2155 are respectively grown on a growth substrate 2059 ((a) of FIG. 16).

When the n-type semiconductor layer 2153 is grown, the active layer 2154 is then grown on the n-type semiconductor layer 2153, and the p-type semiconductor layer 2155 is then grown on the active layer 2154. When the n-type semiconductor layer 2153, the active layer 2154 and the p-type semiconductor layer 2155 are sequentially grown as described above, a layered structure of micro semiconductor light emitting devices is formed as illustrated in (a) of FIG. 16.

The growth substrate 2059 (wafer) may be formed of any one of materials having light transmission properties, for example, sapphire ($Al_2O_3$), GaN, ZnO, and AlO, but is not limited thereto. Furthermore, the growth substrate 2059 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Next, at least part of the active layer 2154 and the p-type semiconductor layer 2155 are removed to expose at least part of the n-type semiconductor layer 2153 ((b) of FIG. 16).

In this case, the active layer 2154 and the p-type semiconductor layer 2155 are partly removed in a vertical direction, and the n-type semiconductor layer 2153 is exposed to the outside. Through this, a mesa process is carried out. Then, the n-type semiconductor layer 2153 is etched to isolate a plurality of light emitting devices so as to form a light emitting device array. As described above, the p-type semiconductor layer 2155, the active layer 2154, and the n-type semiconductor layer 2153 are etched to form a plurality of micro semiconductor light emitting devices.

Next, an n-type electrode 2152 and a p-type electrode 2156 having a height difference in a thickness direction are formed on the n-type semiconductor layer 2153 and the p-type semiconductor layer 2155, respectively, so as to implement a flip chip type light emitting device ((c) of FIG. 16).

The n-type electrode 2152 and the p-type electrode 2156 may be formed by a deposition process such as sputtering, but the present disclosure is not necessarily limited thereto. Here, the n-type electrode 2152 may be the foregoing second conductive electrode, and the p-type electrode 2156 may be the first conductive electrode.

Next, in a state where the n-type electrode 2152 and the p-type electrode 2156 are formed, a conductive adhesive is coated on the electrodes of the first semiconductor light emitting devices to form a conductive adhesive layer 2030 ((d) of FIG. 16)).

In this case, the conductive adhesive layer 2030 may be formed on one surface of the semiconductor light emitting device, or may have a size capable of surrounding a side surface of the semiconductor light emitting device. For such an example, a width of the conductive adhesive layer 2030 may be smaller than or equal to that of the p-type electrode 2156 and coated on the p-type electrode 2156.

For another example, a width of the conductive adhesive layer 2030 may be 1 to 1.5 times larger than that of the p-type electrode 2156. Moreover, the conductive adhesive layer 2030 may be formed in a larger size than the maximum cross-sectional area of the semiconductor light emitting device. At this time, the conductive adhesive layer 2030 may be formed in a structure of completely surrounding a side surface of the semiconductor light emitting device by a bonding process.

The conductive adhesive is formed on the substrate 2010 at a position corresponding to the first electrode 2020. For such an example, the conductive adhesive is coated on the p-type electrode 2156. More specifically, the conductive adhesive is coated on the p-type electrode 2156 of each of the plurality of semiconductor light emitting devices, thereby forming a plurality of adhesive regions spaced apart from each other on the wiring board.

In this case, the conductive adhesive is coated on only part of the plurality of semiconductor light emitting devices on the growth substrate. The conductive adhesive may be selectively pattern-printed on the growth substrate by at least one of screen printing, dispensing, and liquid-phase pattern transfer. For an example of the pattern, the conductive type adhesive may be coated on two semiconductor light emitting devices with at least one semiconductor light emitting device therebetween. This may be carried out in both row and column directions. As described above, according to the intention of the designer, the conductive adhesive may be coated only on a desired semiconductor light emitting device.

However, the present disclosure is not necessarily limited thereto, and for example, the conductive adhesive may be coated on a wiring electrode on the wiring board using pattern printing, instead of the growth substrate.

Meanwhile, the conductive adhesive may include at least one of an anisotropic conductive adhesive (ACA), a silver paste, a tin paste, and a solder paste.

In the case of the anisotropic conductive adhesive, it may be in the form of a paste having anisotropic conductivity. The anisotropic conductive adhesive may include a binder, an epoxy resin, a curing agent, and a conductive ball. In addition, a filler, a coupling agent, and a solvent may be further included in the anisotropic conductive adhesive.

In addition, a white pigment may be added to the anisotropic conductive adhesive to reflect light escaping to the outside between the semiconductor light emitting device and the wiring board. Moreover, an inorganic powder may be added to the anisotropic conductive adhesive, thereby increasing thixotropy and improving printing property.

Next, a space between the semiconductor light emitting devices spaced apart may be filled with an insulating material. In other words, the process of pattern-printing the conductive adhesive on the growth substrate, and then printing or coating an insulating material on the growth substrate is carried out (not shown).

The present process may be a B-stage process for ensuring post-printing processability, and a reactive solvent may be added to the anisotropic conductive adhesive for the B-stage process.

Next, the first semiconductor light emitting devices 2050a are aligned on the first wiring board 2010a having wiring electrodes, and then the growth substrate 2059 is removed ((a) of FIG. 17).

The first electrode 2020 is provided on the first wiring board 2010a, and the first electrode 2020 is disposed along a row direction so as to serve as a data electrode in the display apparatus 2000 of the present disclosure.

The growth substrate is removed using a laser lift-off method (LLO) or a chemical lift-off method (CLO), and the semiconductor light emitting device is bonded to the conductive adhesive prior to removal. In this case, the laser lift-off method or chemical lift-off method is selectively carried out only on the semiconductor light emitting device on which the conductive adhesive is coated. Therefore, the semiconductor light emitting devices on which the conductive adhesive is not coated remain on the removed growth substrate.

The wiring electrodes 2020 of the wiring board 2010a and the p-type electrodes 2020 of the first semiconductor light emitting devices 2050a are electrically connected to each other during bonding, and thus the wiring electrode of the wiring board 2010a may be a p-common electrode.

Subsequent to the bonding and growth substrate removal processes, the process of filling a space between the semiconductor light emitting devices with an insulating material ((b) of FIG. 17) may be carried out. As described above, the insulating material 2070 may be formed of a material different from the conductive adhesive layer.

Then, a second electrode 2040 (refer to FIG. 10) extended in one direction from the n-type semiconductor layer to electrically connect the plurality of semiconductor light emitting devices may be connected to the n-type electrode 2152.

Next, for the implementation of red, green, and blue, the process of forming the above-described phosphor layer or a color substrate is carried out, and thereby a single display apparatus may be completed.

A single display apparatus is completed using part of the semiconductor light emitting devices on the growth substrate as described above, and then another display apparatus is manufactured using other semiconductor light emitting devices on the growth substrate.

For example, the process of coating the conductive adhesive on the electrodes of the second semiconductor light emitting devices 2050b may be carried out ((a) of FIG. 18).

By the manufacturing process of FIGS. 16 and 17, the semiconductor light emitting devices are arranged and remained at specific intervals at the foregoing growth substrate. In the present process, a conductive adhesive is pattern-printed again on other semiconductor light emitting devices on the growing substrate to implement transfer of the growth substrate a plurality of times.

Then, the process of aligning the second semiconductor light emitting devices 2050b on the second wiring board 2010b, and then removing the growth substrate is carried out ((b) of FIG. 18).

Subsequent to the bonding and growth substrate removal processes, the process of filling a space between the semiconductor light emitting devices with an insulating material ((c) of FIG. 18), the process of forming the second electrode 2040 ((d) of FIG. 18), and the process of forming a phosphor layer or a color filter may be carried out, thereby completing another display apparatus.

According to such a method, a conductive liquid phase may be selectively patterned in a region of the semiconductor light emitting device to be transferred to perform a transfer pattern of the same semiconductor light emitting device on a single growth substrate.

Meanwhile, the above-described manufacturing method may also be applicable to a method of individually transferring red semiconductor light emitting devices, green semiconductor light emitting devices, and blue semiconductor light emitting devices to implement red, green, and blue colors as well as a method of performing multiple transfers on the same pattern. Hereinafter, such application examples will be described in detail with reference to the drawings.

FIGS. 19, 20A, 20B and 21 are conceptual views showing another example of a manufacturing method of a display apparatus using semiconductor light emitting devices according to the present disclosure.

Figure 19:
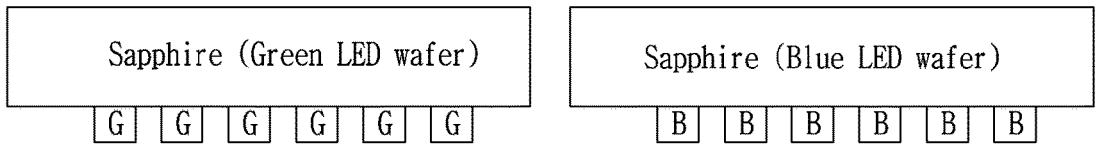
FIGS. 19, 20A, 20B and 21 are conceptual views showing another example of a manufacturing method of a display apparatus using semiconductor light emitting devices according to the present disclosure.
Figure 19:
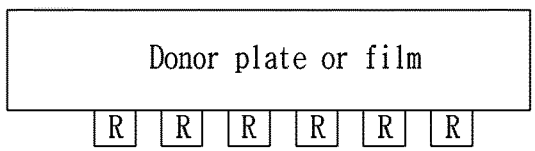
Figure 19:
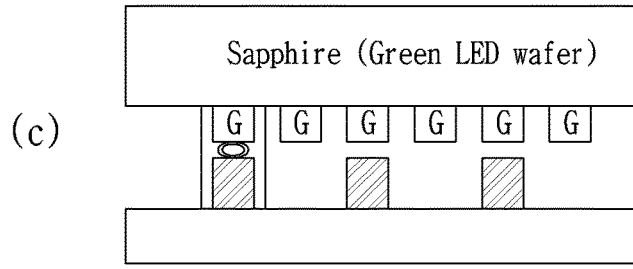
Figure 19:
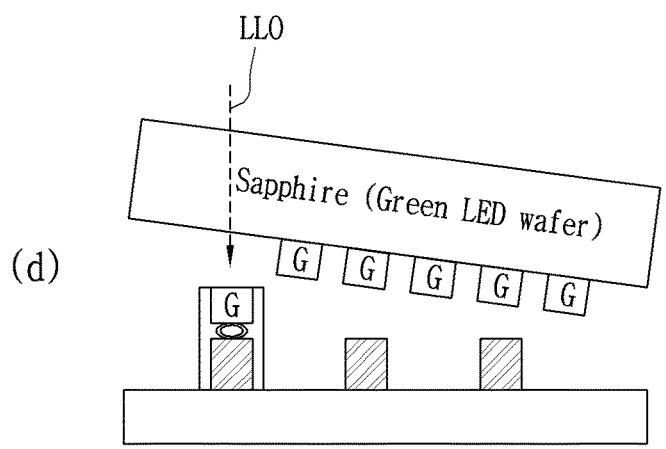

First, green semiconductor light emitting devices and blue semiconductor light emitting devices are separately grown on a growth substrate (LED wafer) such that the light emitting structure of a green semiconductor light emitting device and a blue semiconductor light emitting device is grown according to the manufacturing method ((a) of FIG. 19). As illustrated in the drawing, the growth substrate may be a sapphire substrate.

At this time, in each of the growth substrates (Green LED wafer, Blue LED wafer), the process described with reference to (a), (b) and (c) of FIG. 16 is carried out on each growth substrate (green LED wafer, blue LED wafer), thereby providing green light emitting devices on a first growth substrate (green LED wafer), and providing blue light emitting devices on a second growth substrate (blue LED wafer).

In this case, the green semiconductor light emitting devices and the blue semiconductor light emitting devices may be provided on a growth substrate, and the red semiconductor light emitting devices may be provided on a donor plate or film. However, the present disclosure is not necessarily limited thereto. For example, a red pixel may be implemented by a combination of a blue semiconductor light emitting device and a red phosphor or a color filter, and this case will be described later.

Next, the process of coating a conductive adhesive on an electrode of the green semiconductor light emitting devices or a first portion corresponding to the green semiconductor light emitting devices on a wiring electrode of the wiring board is carried out ((b) of FIG. 19). In the present process, the above-described manufacturing method in (d) of FIG. 16 may be applicable, and a case where a conductive adhesive is coated on the electrodes of the green semiconductor light emitting devices is illustrated.

As described above, the conductive adhesive may be selectively pattern-printed on the growth substrate by at least one of screen printing, dispensing, and liquid-phase pattern transfer. Furthermore, the conductive adhesive may be at least one of a liquid-phase anisotropic conductive adhesive (ACA), a silver paste, a tin paste, and a solder paste.

Then, the process of coupling the green semiconductor light emitting devices to the first portion is carried out. As described above with reference to (a) of FIG. 17, the green semiconductor light emitting devices are aligned on a first wiring board 3010a provided with the wiring electrodes ((c) of FIG. 19) and then the growth substrate is removed ((d) of FIG. 19).

Figure 20A:
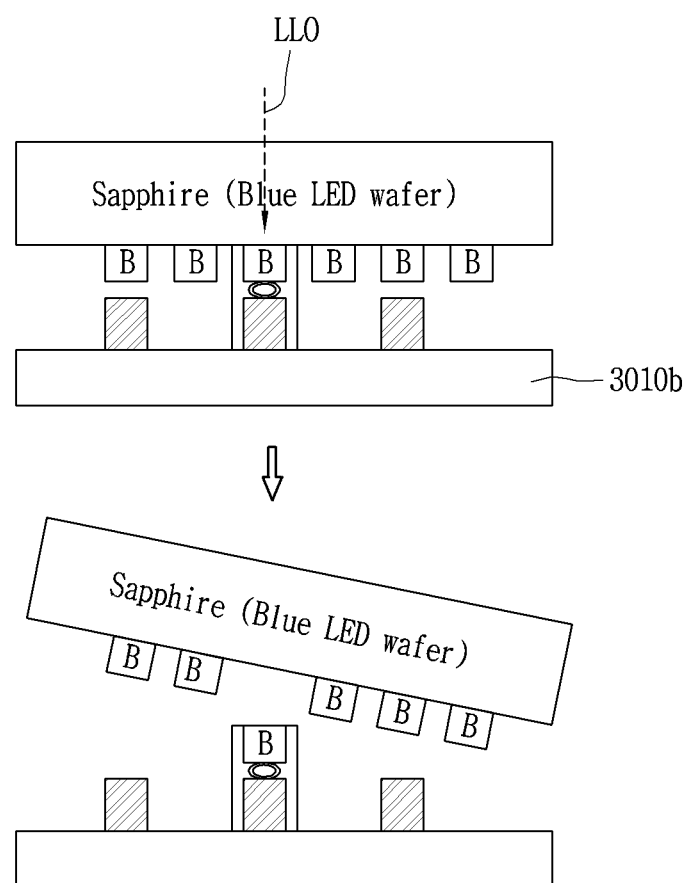
Figure 20B:
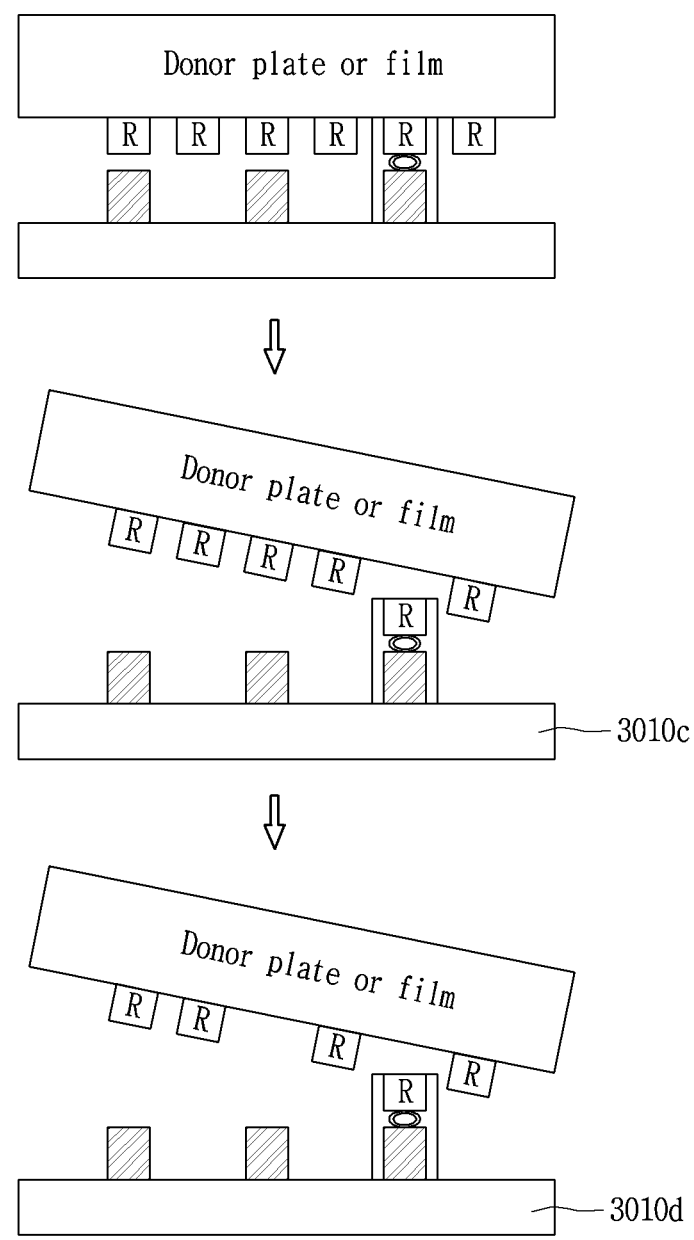

Next, a blue semiconductor light emitting device is bonded and transferred to a desired position on a second wiring board 3010b other than the first wiring board 3010a in a method similar to that of FIG. 19 (FIG. 20A). Furthermore, a red semiconductor light emitting device is bonded and transferred to a desired position on a wiring board other than the first wiring board from a donor plate (FIG. 20B). In this case, the bonding and transfer processes are carried out on a third wiring board 3010*c* and a fourth wiring board 3010*d*, respectively, and therefore, an empty space in which a plurality of red semiconductor light emitting devices have been transferred may be formed on the donor plate (FIG. 19B).

Figure 21:
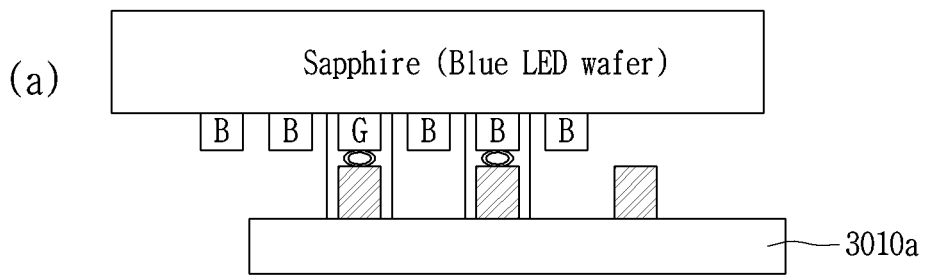
Figure 21:
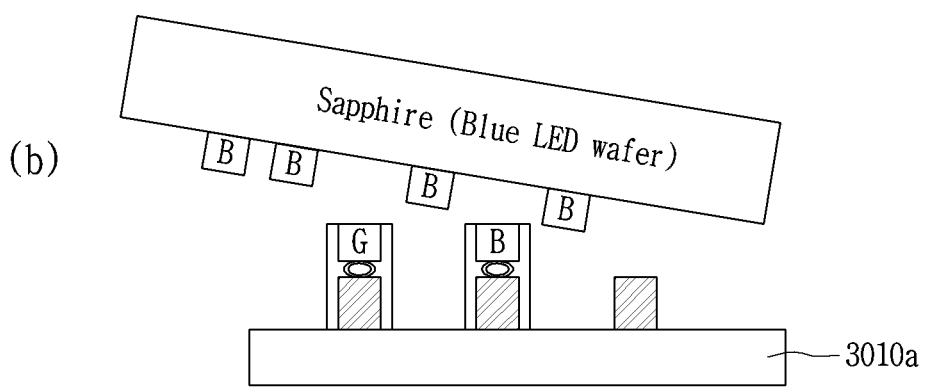
Figure 21:
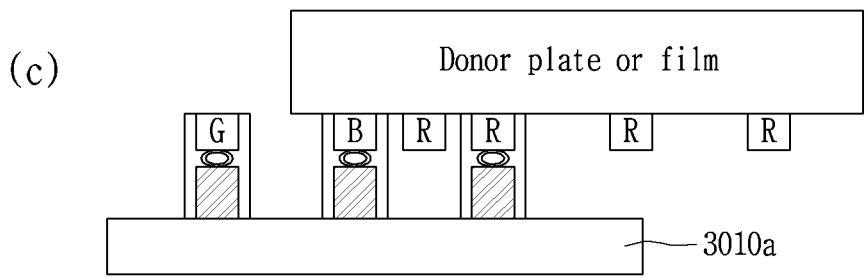
Figure 21:
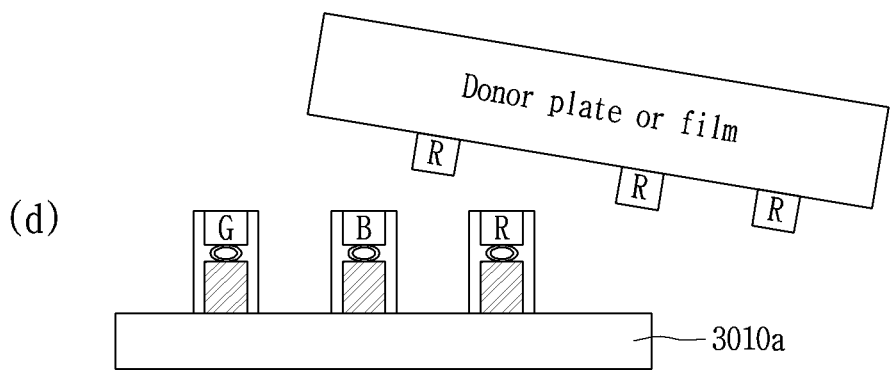

Next, the process of coating the conductive adhesive on a second portion corresponding to the blue semiconductor light emitting devices on the electrodes of the blue semiconductor light emitting devices or the wiring electrodes, and coupling the blue semiconductor light emitting devices to the second portion may be carried out ((a) and (b) of FIG. 21).

For example, the blue semiconductor light emitting devices are transferred to a desired position of the first wiring board 3010*a* using a growth substrate (blue LED wafer) on which a semiconductor light emitting device has been transferred to the second wiring board. The growth substrate used in this case may be a second growth substrate (Blue LED wafer) on which at least one transfer has been carried out to generate one empty space. At this time, the above-described manufacturing method in (d) of FIG. 16 and the manufacturing method in (a) of FIG. 17 may be applicable.

Furthermore, the process of coating the conductive adhesive on a third portion corresponding to the red semiconductor light emitting devices on the electrodes of the red semiconductor light emitting devices or the wiring electrodes, and coupling the red semiconductor light emitting devices to the third portion may be carried out ((c) and (d) of FIG. 21).

Finally, the red semiconductor light emitting device are transferred to a desired position of the first wiring board 3010*a* using a donor plate on which a semiconductor light emitting device has been transferred to the third wiring board 3010*c* and the fourth wiring board 3010*d*. The growth substrate used in this case may be a substrate on which at least two transfers have been carried out to generate two empty spaces. Even at this time, the manufacturing method in (d) of FIG. 16 and the manufacturing method in (a) of FIG. 17 may be applicable.

Then, on the second wiring board 3010*b* or the third wiring board 3010*c* using an empty space at an individually transferred position, bonding transfer is carried out for a color pixel other than pixels already transferred to the substrate.

For an example, the process of aligning the growth substrate of the green semiconductor light emitting devices to another wiring board and transferring the green semiconductor light emitting devices to the another wiring board may be carried out. Similarly, the process of aligning the growth substrate of the blue semiconductor light emitting devices to another wiring board and transferring the blue semiconductor light emitting devices to the another wiring board may be carried out.

Furthermore, a method of transferring the blue semiconductor light emitting devices to a desired position of the second wiring board 3010*b* using a growth substrate on which a semiconductor light emitting device has been transferred to the first wiring board 3010*a* is also allowed. In this case, the semiconductor light emitting device that has been coupled to the another wiring board may be aligned at a portion where the green semiconductor light emitting device is not present by coupling the green semiconductor light emitting devices to the first portion.

In the present example, green, blue, and red may be transferred using an empty space of the initially transferred substrate irrespective of the order. According to the manufacturing method described above, the green semiconductor light emitting device and the blue semiconductor light emitting device may be grown on separate substrates and then individually transferred to a single wiring board.

Figure 22:
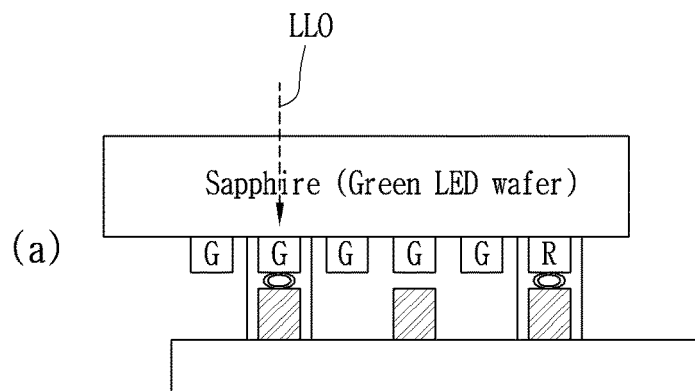
FIGS. 22 and 23 are conceptual views illustrating another manufacturing method of the present disclosure.
Figure 22:
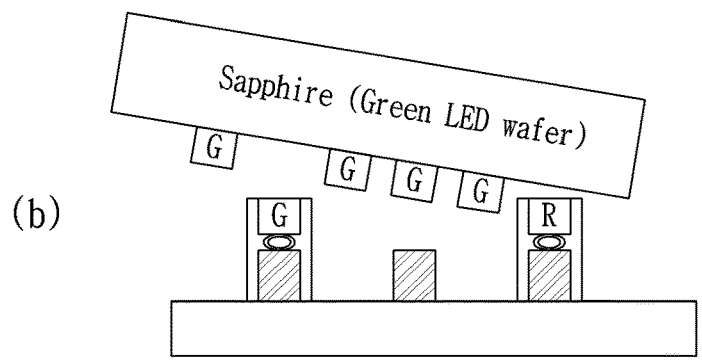
Figure 22:
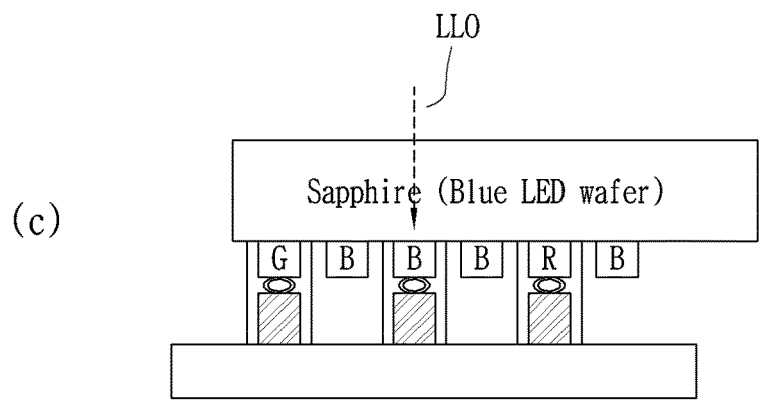
Figure 22:
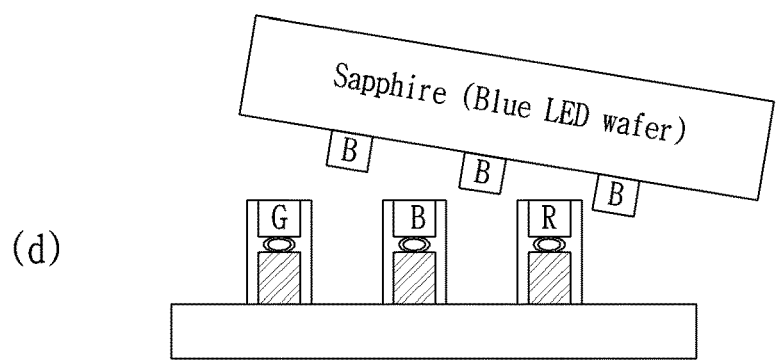
Figure 23:
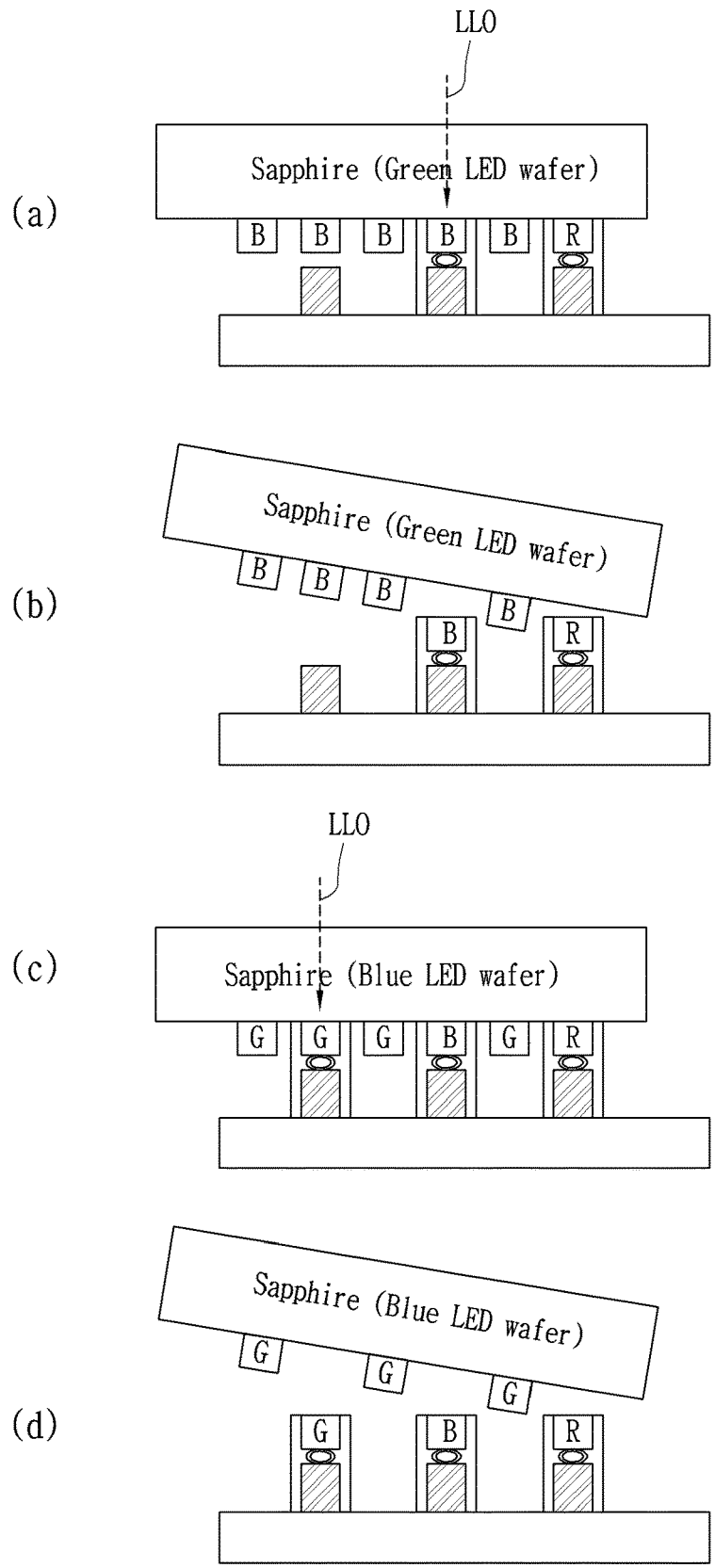

On the other hand, FIGS. 22 and 23 illustrate another manufacturing method of the present disclosure.

In (a) of FIG. 22 and (a) in FIG. 23, it is shown that a growth substrate of green semiconductor light emitting devices and a growth substrate of blue semiconductor light emitting devices in which one semiconductor light emitting device is missing are respectively bonded to a substrate on which a red semiconductor light emitting device has been previously transferred. Through this, a substrate with green and red and a substrate with blue and red may be manufactured as shown in (b) of FIG. 22 and (b) of FIG. 23.

Next, a blue semiconductor light emitting device is bonded and transferred to the substrate with green and red using the growth substrate of blue semiconductor light emitting devices in which the two semiconductor light emitting devices are missing as shown in (c) and (d) of FIG. 22. Similarly, a green semiconductor light emitting device is bonded and transferred to the substrate with blue and red using the growth substrate of green semiconductor light emitting devices in which two semiconductor light emitting devices are missing as shown in (c) and (d) of FIG. 23.

As described above, by the manufacturing method illustrated in FIGS. 22 and 23, it may be possible to individually bond green, blue, and red semiconductor light emitting devices to the wiring board while using multiple transfers on a large area growth substrate.

Figure 24:
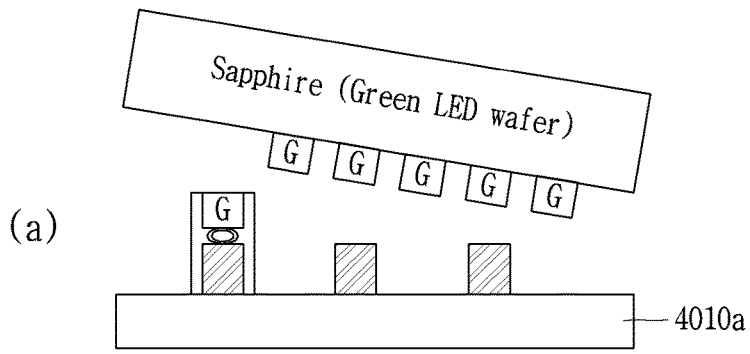
FIGS. 24 and 25 are conceptual views showing a manufacturing method of bonding and transferring only blue and green semiconductor light emitting devices to a wiring board.
Figure 24:
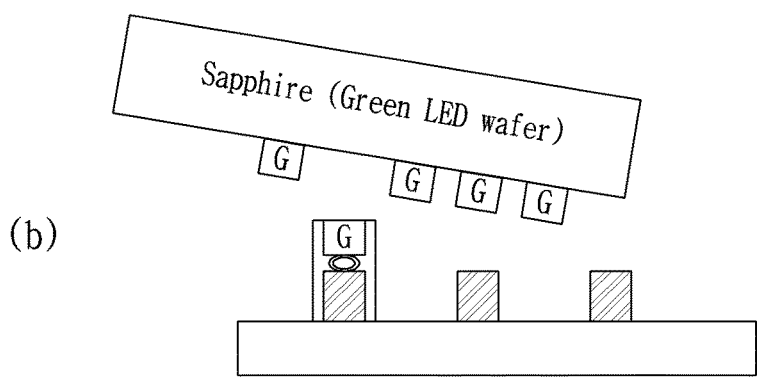
Figure 24:
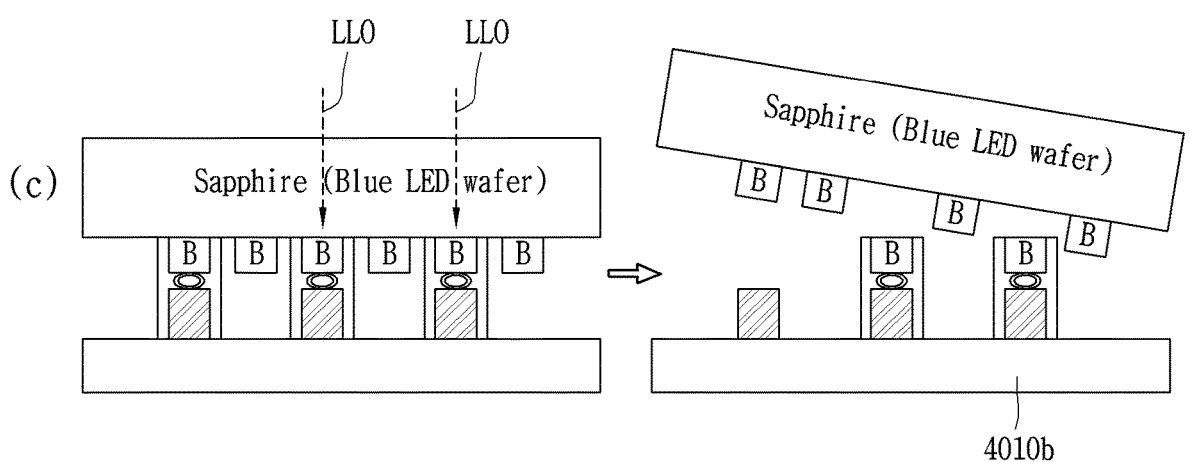
Figure 24:
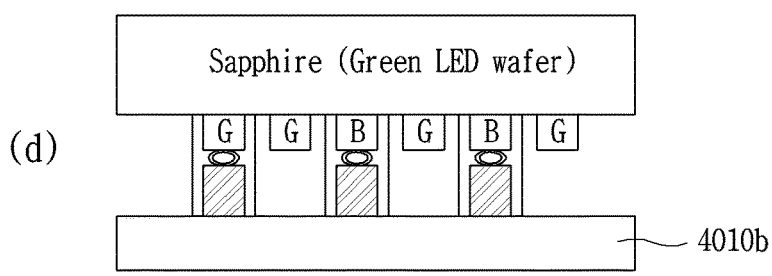
Figure 25:
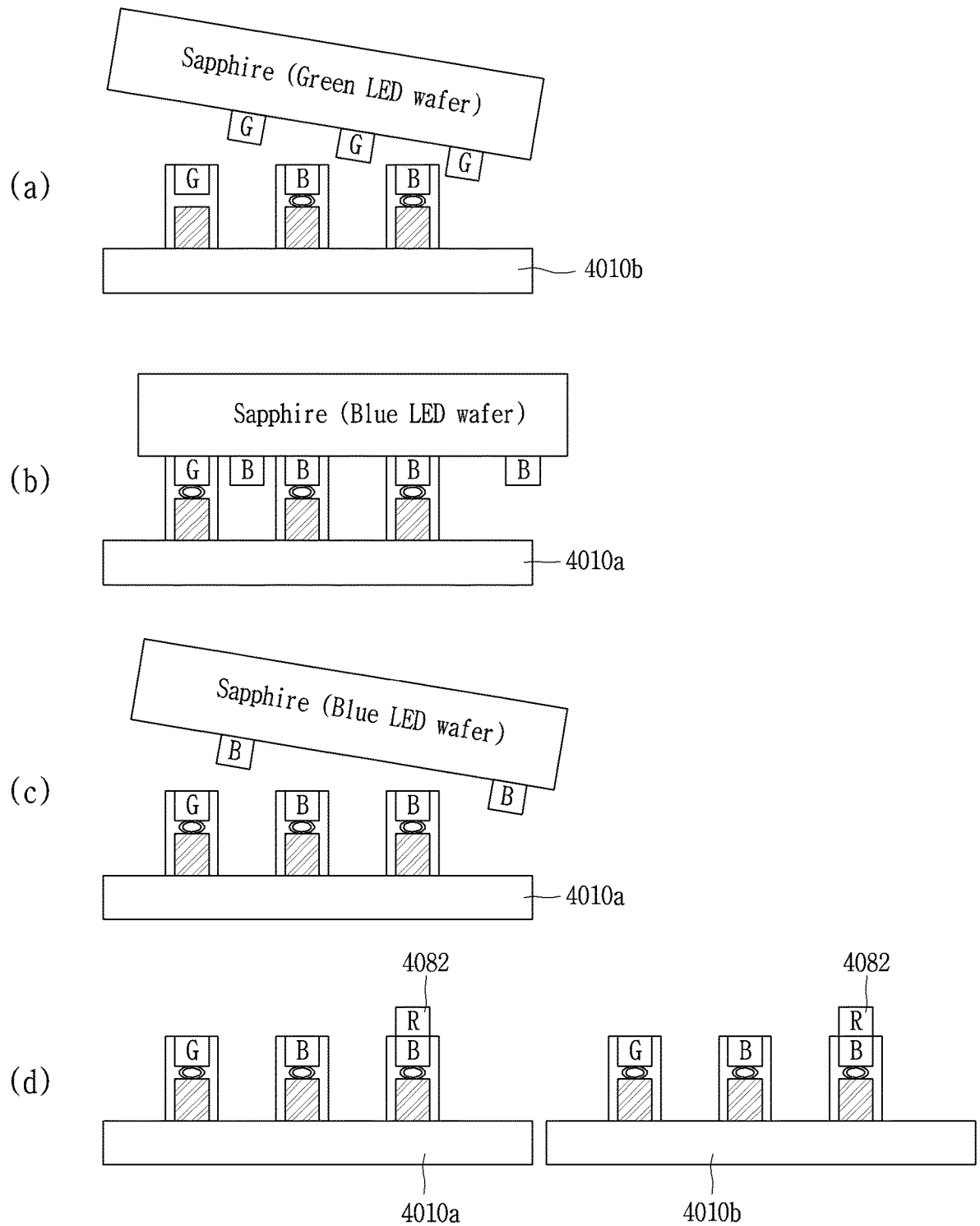

Meanwhile, as described above, in the present example, the red semiconductor light emitting device may be replaced with a combination of a blue semiconductor light emitting device and a phosphor layer. FIGS. 24 and 25 are conceptual views showing a manufacturing method of bonding and transferring only blue and green semiconductor light emitting devices to a wiring board.

In (a), (b) and (c) of FIG. 24, multiple transfers are carried out on a single growth substrate to prepare a green LED wafer of green semiconductor light emitting devices in which two semiconductor light emitting devices are missing and a blue LED wafer of blue semiconductor light emitting devices in which two blue semiconductor light emitting devices have been transferred once.

In this case, a green LED wafer of green semiconductor light emitting devices in which two semiconductor light emitting devices are missing is formed to have two empty spaces with one green semiconductor light emitting device therebetween.

According to (d) of FIG. 24 and (a) of FIG. 25, a green LED wafer of green semiconductor light emitting devices having two empty spaces, formed in (b) of FIG. 24, is aligned with a wiring board 4010*b* to which two blue semiconductor light emitting devices are transferred, formed in (c) of FIG. 24, and one green semiconductor light emitting device is bonded and transferred to the wiring board 4010*b*.

On the other hand, according to (b) and (c) of FIG. 25, using the growth substrate of blue semiconductor light emitting devices in which two blue semiconductor light emitting devices has been transferred, two blue semiconductor light emitting devices are transferred again to the wiring board 4010*a* to which one green semiconductor light emitting device is transferred.

Finally, as shown in FIG. 25D, a red phosphor layer 4082 may be deposited on either one of the two blue semiconductor light emitting devices in the manufactured two wiring boards 4010a, 4010b, respectively, thereby implementing a red pixel.

Furthermore, the manufacturing method described above may use a donor plate other than a wiring board. In this case, the method is the same, but a nonconductive liquid-phase adhesive other than an anisotropic conductive adhesive or a solder may be pattern-printed on the semiconductor light emitting device.

Figure 26:
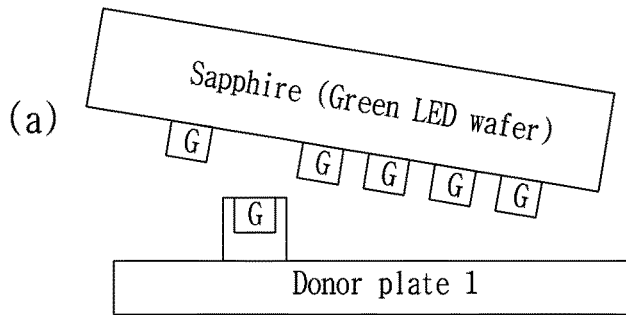
FIG. 26 is a conceptual view showing a process of selectively transferring semiconductor light emitting devices using a donor plate.
Figure 26:
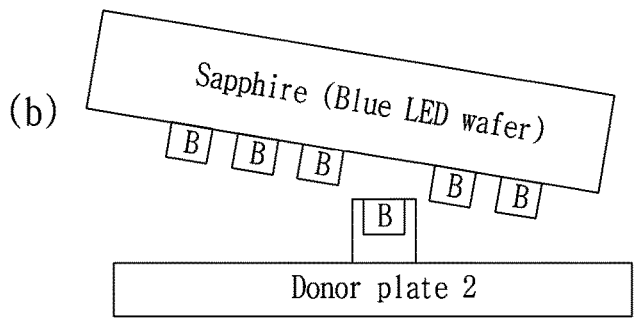
Figure 26:
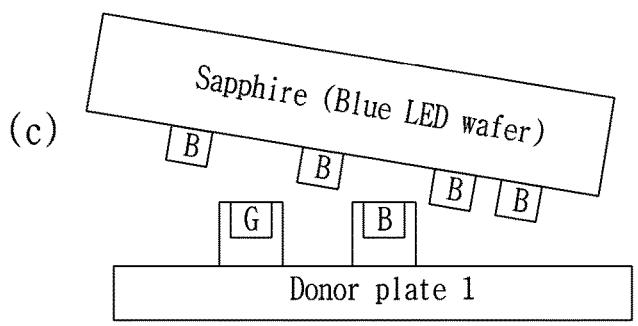
Figure 26:
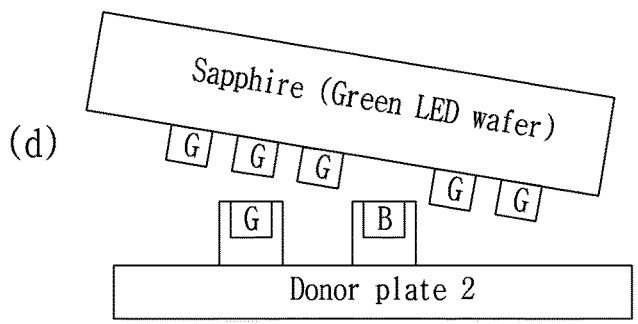
Figure 26:
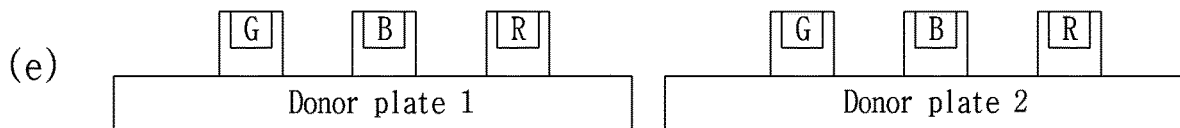

FIG. 26 is a conceptual view showing a process of selectively transferring semiconductor light emitting devices using a donor plate.

As shown in the drawing, a green semiconductor light emitting device and a blue semiconductor light emitting device are grown separately on each growth substrate, and then transferred once to each donor plate (donor plate 1, donor plate 2) by selectively coating a non-conductive adhesive ((a) and (b) of FIG. 26).

Then, respective growth substrates and donor plates are crossed with each other, and the blue semiconductor light emitting device is transferred to the donor plate 1 on which the green semiconductor light emitting device is transferred, and the green semiconductor light emitting device is transferred to the donor plate 2 on which the blue semiconductor light emitting device is transferred ((c) and (d) of FIG. 26).

Next, a red semiconductor light emitting device is transferred to each donor plate (donor plate 1, donor plate 2) on which the blue and green semiconductor light emitting devices are mounted ((e) of FIG. 24). When the donor plates (donor plate 1, donor plate 2) are bonded to a wiring board to manufacture a display apparatus, multiple transfers on a large area wafer may be implemented.

The configurations and methods according to the above-described embodiments will not be applicable in a limited way to the foregoing display apparatus using a semiconductor light emitting device, and all or part of each embodiment may be selectively combined and configured to make various modifications thereto.

What is claimed is:

1. A display apparatus, comprising:
a wiring board having wiring electrodes;
a conductive adhesive layer covering the wiring electrodes;
a plurality of semiconductor light emitting devices coupled to the conductive adhesive layer and electrically connected to the wiring electrodes; and
an insulating material disposed between the plurality of adhesive to fill between the plurality of semiconductor light emitting devices,
wherein at least one of the plurality of semiconductor light emitting devices comprises a first conductive electrode, a first conductive semiconductor layer on the first conductive electrode, an active layer on the first conductive semiconductor layer, a second conductive semiconductor layer on the active layer, and a second conductive electrode on the second conductive semiconductor layer, and
wherein the second conductive electrode is disposed on one surface of the second conductive semiconductor layer.

2. The display apparatus of claim 1, wherein the plurality of adhesive regions have at least one of an anisotropic conductive adhesive (ACA), a silver paste, a tin paste, or a solder paste.

3. The display apparatus of claim 2, wherein a white pigment or an inorganic powder is added to the anisotropic conductive adhesive.

4. The display apparatus of claim 1, wherein the plurality of adhesive regions are further coated on side surfaces of the plurality of semiconductor light emitting devices, so that the plurality of adhesive regions are interposed between the side surfaces of the plurality of semiconductor light emitting devices and the insulating material.

5. The display apparatus of claim 1, wherein the conductive adhesive layer has a plurality of adhesive regions coated in a patterned shape on each electrode of the plurality of semiconductor light emitting devices, and spaced apart from each other on the wiring board.

6. The display apparatus of claim 1, wherein the wiring electrodes comprise a first electrode line and a second electrode line, and
wherein the second conductive electrode is disposed on the second electrode line.

7. The display apparatus of claim 6, wherein the second conductive electrode is disposed at a position overlapping the second electrode line disposed at an upper side of the conductive adhesive layer.

8. The display apparatus of claim 1, wherein the insulating material comprises a material different from that of the conductive adhesive layer.

9. The display apparatus of claim 1, wherein at least part of the second conductive electrode protrudes from a side surface of the second conductive semiconductor layer.

10. The display apparatus of claim 1, wherein the second conductive electrode is exposed to an upper side of the semiconductor light emitting device.

11. A display apparatus, comprising:
a wiring board having wiring electrodes;
a conductive adhesive layer on the wiring electrodes;
a plurality of semiconductor light emitting devices coupled to the conductive adhesive layer and electrically connected to the wiring electrodes; and
an insulating material disposed between the plurality of adhesive regions,
wherein at least one of the plurality of semiconductor light emitting devices comprises a first conductive electrode, a first conductive semiconductor layer on the first conductive electrode, an active layer on the first conductive semiconductor layer, a second conductive semiconductor layer on the active layer, and a second conductive electrode on the second conductive semiconductor layer, and
wherein at least part of the second conductive electrode protrudes from a surface of the second conductive semiconductor layer.

12. The display apparatus of claim 11, wherein the second conductive electrode is disposed on a side surface of the second conductive semiconductor layer.

13. The display apparatus of claim 11, wherein the second conductive electrode comprises a protruding electrode portion extending from the second conductive electrode and protruding from a side surface of the plurality of semiconductor light emitting devices.

14. The display apparatus of claim 13, wherein the protruding electrode portion extends laterally from one surface of the second conductive semiconductor layer and extends to an upper surface of the second conductive semiconductor layer.

15. The display apparatus of claim 13, further comprising an undoped semiconductor layer on the second conductive semiconductor layer, and wherein the protruding electrode portion protrudes along a width direction from a side surface of the undoped semiconductor layer.

16. The display apparatus of claim 11, wherein the plurality of adhesive regions are further coated on side surfaces of the plurality of semiconductor light emitting devices, so that the plurality of adhesive regions are interposed between the side surfaces of the plurality of semiconductor light emitting devices and the insulating material.

17. The display apparatus of claim 11, wherein the conductive adhesive layer has a plurality of adhesive regions coated in a patterned shape on each electrode of the plurality of semiconductor light emitting devices, and spaced apart from each other on the wiring board.

18. The display apparatus of claim 11, wherein the insulating material comprises a material different from that of the conductive adhesive layer.

19. The display apparatus of claim 11, wherein at least part of the second conductive electrode protrudes from a side surface of the second conductive semiconductor layer.

20. The display apparatus of claim 11, wherein the second conductive electrode is exposed to an upper side of the semiconductor light emitting device.

* * * * *